United States Patent
Holmes et al.

(10) Patent No.: US 11,672,187 B2
(45) Date of Patent: Jun. 6, 2023

(54) QUANTUM TUNING VIA PERMANENT MAGNETIC FLUX ELEMENTS

(71) Applicant: International Business Machines Corporation, Armonk, NY (US)

(72) Inventors: Steven J. Holmes, Ossining, NY (US); Devendra K. Sadana, Pleasantville, NY (US); David C. McKay, Ossining, NY (US); Jared Barney Hertzberg, Yorktown Heighls, NY (US); Stephen W. Bedell, Wappingers Falls, NY (US); Ning Li, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 509 days.

(21) Appl. No.: 16/829,439

(22) Filed: Mar. 25, 2020

(65) Prior Publication Data
US 2021/0305480 A1    Sep. 30, 2021

(51) Int. Cl.
*H01L 39/00*    (2006.01)
*H01L 39/02*    (2006.01)
(Continued)

(52) U.S. Cl.
CPC ............ *H01L 39/025* (2013.01); *G06N 10/00* (2019.01); *H01L 29/66977* (2013.01); *H01L 39/223* (2013.01); *G01R 33/0358* (2013.01)

(58) Field of Classification Search
None
See application file for complete search history.

(56) References Cited

U.S. PATENT DOCUMENTS

| 6,930,318 B2 | 8/2005 | Vion et al. |
| 7,180,087 B1 | 2/2007 | Loss et al. |

(Continued)

FOREIGN PATENT DOCUMENTS

| EP | 3 296 932 A1 | 3/2018 |
| WO | 2009072550 | 6/2009 |
| WO | 2018164784 | 9/2018 |

OTHER PUBLICATIONS

International Search Report and Written Opinion received for PCT application No. PCT/EP2021/056073 dated Jul. 2, 2021, 11 pages.
(Continued)

*Primary Examiner* — Bradley Smith
(74) *Attorney, Agent, or Firm* — Amin, Turocy & Watson, LLP

(57) ABSTRACT

Systems and techniques that facilitate quantum tuning via permanent magnetic flux elements are provided. In various embodiments, a system can comprise a qubit device. In various aspects, the system can further comprise a permanent magnet having a first magnetic flux, wherein an operational frequency of the qubit device is based on the first magnetic flux. In various instances, the system can further comprise an electromagnet having a second magnetic flux that tunes the first magnetic flux. In various cases, the permanent magnet can comprise a nanoparticle magnet. In various embodiments, the nanoparticle magnet can comprise manganese nanoparticles embedded in a silicon matrix. In various aspects, the system can further comprise an electrode that applies an electric current to the nanoparticle magnet in a presence of the second magnetic flux, thereby changing a strength of the first magnetic flux.

20 Claims, 25 Drawing Sheets

(51) Int. Cl.
*G06N 10/00* (2022.01)
*H01L 29/66* (2006.01)
*H01L 39/22* (2006.01)
*G01R 33/035* (2006.01)

(56) References Cited

U.S. PATENT DOCUMENTS

| | | | |
|---|---|---|---|
| 9,224,099 | B2 | 12/2015 | Koizumi |
| 9,886,668 | B2 | 2/2018 | Dzurak et al. |
| 10,050,630 | B2 | 8/2018 | Reagor et al. |
| 10,388,848 | B2 | 8/2019 | Thomas et al. |
| 10,482,388 | B1 | 11/2019 | Jock et al. |
| 10,528,884 | B2 | 1/2020 | Morello et al. |
| 2009/0322374 | A1 | 12/2009 | Przybysz et al. |

OTHER PUBLICATIONS

Mooij J.E et al., "Josephson persistent-current qubit", American Association for the Advancement of Science, DOI: 10.1126/SCIENCE.285.5430.1036, vol. 285, No. 5430, Aug. 13, 1999, pp. 1036-1039.

Evans et al., "A highly tunable silicone-based magnetic elastomer with nanoscale homogeneity", Journal of Magnetism and Magnetic Materials, DOI:10.1016/J.JMMM.2011.08.045, vol. 324, No. 4, 18 pages.

Golubovic et al., "Magnetic phase shifter for superconducting qubit", arXiv:cond-mat/0403315v1 [cond-mat.supr-con], Mar. 12, 2004, 4 pages.

Ruster et al., "A long-lived Zeeman trapped-ion qubit", arXiv:1606.07220v1 [quant-ph], Jun. 23, 2016, 6 pages.

Chapman, "Widely Tunable On-Chip Microwave Circulator for Superconducting Quantum Circuits," Thesis, University of Colorado, 2017, 144 pages.

Koch et al., "Charge insensitive qubit design derived from the Cooper pair box," arXiv:cond-mat/0703002 [cond-mat.nes-hall], Sep. 26, 2007, 21 pages.

Schneider et al., "Ultralow power artificial synapses using nanotextured magnetic Josephson junctions,", Sci. Adv. 2018;4: e1701329; Jan. 26, 2018, 8 pages.

Response to the Written Opinion of the ISR under R.159(1)(b) EPC filed Oct. 17, 2022, 6 pages.

QUANTUM TUNING VIA PERMANENT MAGNETIC FLUX ELEMENTS

BACKGROUND

The subject disclosure relates to quantum tuning, and more specifically to quantum tuning via permanent magnetic flux elements.

Precise tuning of qubit operational frequencies (e.g., flux tuning) can be implemented to help improve quantum circuit performance. Generally, a single-junction qubit device (e.g., a single Josephson Junction) has a fixed operational frequency. Various multi-junction qubit devices, on the other hand, can have variable operational frequencies that are functions of magnetic fluxes (e.g., magnetic fields) to which the multi-junction qubit devices are exposed. For example, a SQUID loop (e.g., a superconducting quantum interference device loop, such as two Josephson Junctions coupled in parallel) can have an overall operational frequency that is based on and/or depends on a magnetic flux that passes through the loop (e.g., that passes between the two Josephson Junctions). The operational frequencies of such qubit devices can thus be controlled/modulated by controlling/modulating the magnetic fluxes to which those qubit devices are exposed.

In various cases, each qubit device in a quantum circuit can require individualized/independent flux tuning so as to achieve individualized/independent operational frequencies. Moreover, optimal quantum circuit performance can require that each individualized/independent operational frequency of each qubit device be sustained over individualized/independent periods of time. To facilitate such flux tuning, an individualized/independent magnetic flux can be required for each qubit device. In various cases, each magnetic flux can be required to be sustained over an associated period of time, each magnetic flux can be required to be directed toward only its associated qubit device (e.g., otherwise, neighboring qubit devices can be mistakenly affected which can introduce noise and reduce coherence), each magnetic flux can be required to be uniform across its associated qubit device (e.g., otherwise, coherence can be reduced), and each magnetic flux can be required to be strong enough to shift the operational frequency of its associated qubit device.

Conventionally, flux tuning of a qubit device is facilitated by an electromagnet (e.g., a flux coil that generates a magnetic flux when an electric current is applied to the flux coil and that does not generate a magnetic flux when no electric current is applied to the flux coil). To facilitate flux tuning of a qubit device, an electric current is applied to the electromagnet, which causes the electromagnet to emit a magnetic flux onto the qubit device. The magnetic flux shifts, changes, affects, and/or otherwise influences the operational frequency of the qubit device. For instance, when not exposed to a magnetic flux, the operational frequency of the qubit device can be at a first value. When exposed to the magnetic flux of the electromagnet, the operational frequency of the qubit device can change from the first value to a second value. The second value can depend upon and/or be based on the strength and/or orientation of the magnetic flux emitted by the electromagnet (e.g., the second value can range from being much higher to only slightly higher than the first value depending on the magnetic flux to which the qubit device is exposed, and/or the second value can range from being much lower to only slightly lower than the first value depending on the magnetic flux to which the qubit device is exposed). The strength and/or orientation of the magnetic flux emitted by the electromagnet is controlled/modulated by controlling/modulating the electric current that is applied to the electromagnet.

Such conventional systems/techniques for facilitating flux tuning require sustained and/or active flowing of electric current. After all, the electromagnet used in conventional systems can emit a magnetic flux only when electric current is actively applied to the electromagnet. Once the electric current is no longer applied to the electromagnet, the electromagnet ceases to emit the magnetic flux, which causes the operational frequency of the qubit device to revert back to its original/initial value. Thus, conventional systems/techniques require that an electric current flow for the entire period of time during which the qubit device needs a modulated/controlled operational frequency.

The use of actively flowing electric current presents several technical problems. Specifically, actively flowing electric current generates heat. Since proper operation of quantum circuits often requires the surrounding environment of the quantum circuit to be maintained at cryo-temperatures, additional heat generated by actively flowing electric current can increase local temperatures surrounding the chips and/or components on which the quantum circuit is implemented, which can interfere with proper operation of the quantum circuit. Moreover, actively flowing electric current can be unstable. For example, the magnitude and/or phase of the electric current can experience perturbations (e.g., even when voltage and/or current regulators are implemented), which can cause corresponding perturbations in the magnetic flux emitted by the electromagnet, which can, in turn, cause corresponding perturbations in the operational frequency of the qubit device. Such perturbations in the operational frequency of the qubit device can negatively impact performance of the quantum circuit.

In various instances, embodiments of the invention can solve one or more of these problems in the prior art.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, devices, systems, computer-implemented methods, apparatus and/or computer program products that facilitate quantum tuning via permanent magnetic flux elements are described.

According to one or more embodiments, a system is provided. The system can comprise a qubit device. In various aspects, the system can further comprise a permanent magnet in proximity to the qubit device. In various aspects, the permanent magnet can emit a first magnetic flux onto the qubit device. In various cases, an operational frequency of the qubit device can be based on the first magnetic flux. In various aspects, the system can further comprise an electromagnet in proximity to the permanent magnet. In various aspects, the electromagnet can emit a second magnetic flux onto the permanent magnet. In various aspects, the second magnetic flux can tune the first magnetic flux. In various embodiments, the permanent magnet can be a nanoparticle magnet. In various embodiments, the nanoparticle magnet can comprise manganese nanoparticles embedded in a silicon matrix. In various embodiments, the system can further comprise an electrode that applies an electric current to the nanoparticle magnet in a presence of the second magnetic flux. In various aspects, a strength of the first magnetic flux can change based on the nanoparticle magnet being exposed to the electric current and to the second magnetic flux. In various embodiments, the electrode can remove the electric current and the electromagnet can remove the second magnetic flux based on the first magnetic flux attaining a predetermined strength.

According to one or more embodiments, the above-described system can be implemented as a method.

According to one or more embodiments, an apparatus is provided. In various aspects, the apparatus can comprise a nanoparticle magnet in proximity to a Josephson Junction device. In various aspects, the nanoparticle magnet can emit a tunable permanent magnetic field onto the Josephson Junction device. In various instances, an operational frequency of the Josephson Junction device can be based on the tunable permanent magnetic field. In various aspects, the apparatus can further comprise a flux coil in proximity to the nanoparticle magnet. In various aspects, the flux coil can tune the tunable permanent magnetic field. In various embodiments, the nanoparticle magnet can comprise manganese nanoparticles embedded in a silicon matrix. In various embodiments, the apparatus can further comprise an electrode. The electrode can apply a current to the nanoparticle magnet as the nanoparticle magnet is exposed to a magnetic field of the flux coil. In various aspects, a value of the tunable permanent magnetic field can change based on the nanoparticle magnet being exposed to the current and to the magnetic field of the flux coil. In various embodiments, the electrode can remove the electric current and the flux coil can remove the magnetic field based on the tunable permanent magnetic field attaining a threshold value.

As mentioned above, conventional systems/techniques for facilitating flux tuning of a qubit device involve emitting, by an electromagnet, a magnetic flux (e.g., a magnetic field) onto the qubit device. The electromagnet emits the magnetic flux when an electric current is applied to the electromagnet and does not emit the magnetic flux when an electric current is not applied to the electromagnet. Moreover, the operational frequency of the qubit device shifts from an initial value to a modulated value when the qubit device is exposed to the magnetic flux of the electromagnet, and the operational frequency of the qubit device shifts from the modulated value back to the initial value when the qubit device is no longer exposed to the magnetic flux of the electromagnet. Thus, conventional systems/techniques require sustained and/or actively flowing electric current in order to facilitate flux tuning, since electric current must be flowing for the entire period of time during which the operational frequency of the qubit device is desired to be maintained at the modulated value.

As explained above, sustained and/or actively flowing electric current presents technical problems in the field of flux tuning. Specifically, actively flowing electric current generates excess heat, which can negatively affect performance of a quantum circuit (e.g., quantum circuits are generally implemented at temperatures near absolute zero, and excess heat can undesirably increase such temperatures). Additionally, actively flowing electric current can lack sufficient stability for optimal quantum performance (e.g., a magnitude and/or phase of an actively flowing electric current sustained over a period of time can experience perturbations, which causes corresponding perturbations in the magnetic flux emitted by the electromagnet, which in turn causes corresponding perturbations in the operational frequency of the qubit device).

Various embodiments of the invention can solve one or more of these problems in the prior art. In various aspects, embodiments of the invention can provide quantum tuning via permanent magnetic flux elements. In various instances, quantum tuning via permanent magnetic flux elements can facilitate flux tuning of a qubit device without requiring sustained and/or actively flowing electric current (e.g., can maintain an operational frequency of a qubit device at a modulated value for a period of time without requiring electric current to be flowing for the entirety of that period of time).

In various cases, embodiments of the invention can facilitate flux tuning of a qubit device without sustained and/or actively flowing electric current by implementing a tunable permanent magnet in conjunction with an electromagnet. Specifically, in various aspects, a tunable permanent magnet can emit a first magnetic flux onto a qubit device. In various cases, an operational frequency of the qubit device can be based on the first magnetic flux. Because the tunable permanent magnet is a permanent magnet, an inducing electric current need not be applied to the tunable permanent magnet to generate the first magnetic flux (e.g., the first magnetic flux can be generated by the tunable permanent magnet without expending electric current). When exposed to the first magnetic flux, the operational frequency of the qubit device can shift from an initial value to a modulated value (e.g., where the modulated value can be based on the magnitude and/or orientation of the first magnetic flux). In this way, the operational frequency of the qubit device can be set to the modulated value for any suitable period of time without requiring sustained and/or actively flowing electric current during that suitable period of time (e.g., the operational frequency of the qubit device can remain at the modulated value for as long as the qubit device is exposed to the first magnetic flux, and the tunable permanent magnet can maintain the first magnetic flux without requiring application of an electric current). Thus, the operational frequency of the qubit device can be shifted/transitioned from the initial value to the modulated value without the excess heating or instability that plague conventional systems/techniques.

In various embodiments, it can be desirable to tune in real-time the operational frequency of the qubit device in situ. In various instances, various embodiments of the invention can facilitate such real-time tuning by leveraging an electromagnet in conjunction with the tunable permanent magnet. Specifically, the first magnetic flux of the tunable permanent magnet can, in various embodiments, be controlled, changed, modulated, and/or tuned by applying an electric current to the tunable permanent magnet while the tunable permanent magnet is in the presence of a second magnetic flux. In various aspects, an electromagnet can emit the second magnetic flux onto the tunable permanent magnet, and an electrode can apply the electric current to the tunable permanent magnet. In various cases, when the tunable permanent magnet is exposed to both the electric current and the second magnetic flux, a value and/or strength of the first magnetic flux can change (e.g., the magnitude and/or sign of the change can be controlled based on the magnitude and/or phase of the electric current and the magnitude and/or orientation of the second magnetic flux). In this way, the strength (e.g., magnitude and/or orientation) of the first magnetic flux of the tunable permanent magnet can be controlled/adjusted. Moreover, in various instances, the first magnetic flux of the tunable permanent magnet can retain this changed strength/value even after the electrode and the electromagnet are powered down (e.g., even after the electric current associated with the electrode and the electric current associated with the electromagnet stop flowing).

In various embodiments, the tunable permanent magnet can comprise manganese nanoparticles embedded in a silicon matrix. For instance, manganese nanoparticles embedded in a silicon matrix can be magnetized by applying a current to the manganese nanoparticles embedded in the silicon matrix while the manganese nanoparticles embedded in the silicon matrix are exposed to an external magnetic field. The manganese nanoparticles embedded in the silicon matrix can maintain this magnetization even after the current and the external magnetic field are removed.

In this fashion, real-time and/or in situ flux tuning of a qubit device can be facilitated without requiring sustained and/or actively flowing current. Specifically, various embodiments of the invention can apply electric current (e.g., associated with the electromagnet and the electrode) for short durations when it is desired to transition a strength/value of the magnetic flux of the tunable permanent magnet, which can correspondingly transition an operational frequency of the qubit device. Various embodiments of the invention can then maintain (e.g., via the tunable permanent magnet) the newly transitioned operational frequency of the qubit device without application of electric current. For instance, embodiments of the invention can alter the magnetic flux of the tunable permanent magnet by applying an electric current from the electrode to the tunable permanent magnet while the tunable permanent magnet is exposed to an external magnetic flux from the electromagnet. Once the magnetic flux of the tunable permanent magnet is set as desired, the electrode and the electromagnet can be shut off (e.g., such that current is no longer flowing), and the tunable permanent magnet can retain its newly set magnetic flux. This newly set magnetic flux can, in various cases, cause the operational frequency of the qubit device to correspondingly shift to a new value, and that new value can be maintained by the tunable permanent magnet without the expenditure of electric current.

Therefore, various embodiments of the invention can facilitate flux tuning by expending electric current only to change/transition (e.g., via the electrode and electromagnet) the operational frequency of the qubit device from one value to another. Once the operational frequency of the qubit device is changed/transitioned as desired, various embodiments of the invention can maintain the changed/transitioned operational frequency (e.g., via the tunable permanent magnet) without expending electric current. In stark contrast, conventional systems/techniques for facilitating flux tuning rely exclusively on electromagnets, which require sustained and/or actively flowing electric current for the entire time period during which the operational frequency of the qubit device is desired to be modulated (e.g., conventional systems/techniques require current to continuously flow not only to change/transition an operational frequency of the qubit device from one value to another, but also to maintain that new operational frequency after the change/transition). Because various embodiments of the invention can provide flux tuning without actively flowing current, such embodiments can experience less excess heating and less instability as compared to conventional systems/techniques, which can result in improved performance of quantum circuits as compared to conventional systems/techniques. Thus, various embodiments of the invention constitute a concrete technical improvement over the prior art in the field of flux tuning.

DETAILED DESCRIPTION

Figure 1:
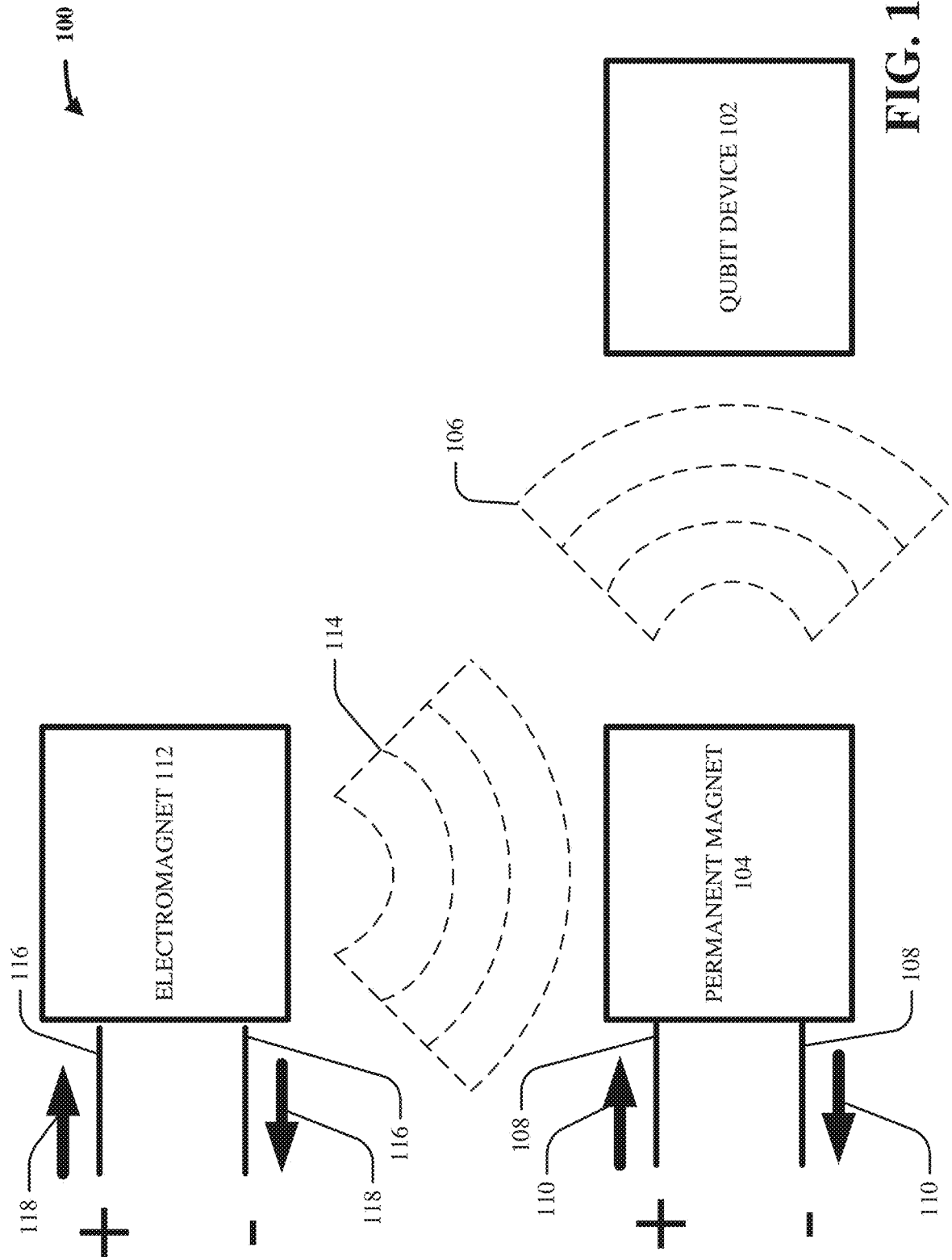
FIG. 1 illustrates a block diagram of an example, non-limiting system that facilitates quantum tuning via permanent magnetic flux elements in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Flux tuning of a qubit device (e.g., a SQUID loop) involves exposing the qubit device to a magnetic flux, where the operational frequency of the qubit device is a function of the magnitude and/or phase of the magnetic flux. Thus, the operational frequency of the qubit device can be controlled and/or modulated by controlling and/or modulating the magnetic flux to which the qubit device is exposed.

As explained above, conventional systems/techniques for facilitating flux tuning involve emitting, via an electromagnet, the magnetic flux onto the qubit device. The electromagnet is often a flux coil that generates the magnetic flux when exposed to an electric current and that ceases to generate the magnetic flux when not exposed to an electric current. Thus, conventional systems/techniques can facilitate flux tuning only by sustaining an actively flowing electric current for the entire period of time during which the operational frequency of the qubit device is desired to be modulated (e.g., conventional systems/techniques require the expenditure of electric current both to transition the operational frequency of the qubit device to a modulated value and to maintain the operational frequency of the qubit device at the modulated value). As explained above, sustaining actively flowing electric current in such way can cause excess heating of the quantum circuit (e.g., according to Ohm's law, current traveling through a conductor with non-zero resistance dissipates some energy as heat). Moreover, sustaining actively flowing electric current in such way can also cause instability of the operational frequency of the qubit device (e.g., the magnitude and/or phase of the electric current can experience perturbations even when voltage/current regulators are used, which cause corresponding perturbations in the magnetic field generated by the electromagnet, which, in turn, cause corresponding perturbations in the operational frequency of the qubit device). These are undesirable technical problems that affect conventional systems/techniques for facilitating flux tuning.

Various embodiments of the invention can solve one or more of these problems in the prior art. In various aspects, embodiments of the invention can leverage both a tunable permanent magnet and an electromagnet to facilitate flux tuning of a qubit device. Specifically, in various instances, the tunable permanent magnet can emit a first magnetic flux onto the qubit device, where an operational frequency of the qubit device is based on the first magnetic flux (e.g., the qubit device can be a SQUID loop). In various aspects, the operational frequency of the qubit device can be at an initial value when the qubit device is not exposed to the first magnetic flux. When the qubit device is exposed to the first magnetic flux, the operational frequency of the qubit device can shift from the initial value to a modulated value. Because permanent magnets retain their magnetic properties in the absence of an inducing field or current, the tunable permanent magnet can maintain the first magnetic flux, and can thus keep the operational frequency of the qubit device at the modulated value, without requiring the sustained expenditure of electric current. Because the tunable permanent magnet does not rely upon sustained and/or actively flowing electric current to generate and maintain the first magnetic flux, the tunable permanent magnet can keep the operational frequency of the qubit device at the modulated value without experiencing the excess heating or the instability that trouble conventional systems/techniques.

In various cases, the modulated value can depend on the magnitude and/or orientation of the first magnetic flux (e.g., one combination of magnitude and orientation of the first magnetic flux can cause the modulated value to be lower than the initial value, another combination of magnitude and orientation of the first magnetic flux can cause the modulated value to be higher than the initial value). In various cases, the modulated value can be a function of the first magnetic flux, such that any suitable modulated value of the operational frequency of the qubit device can be attained by correspondingly and/or suitably modulating the first magnetic flux (e.g., by appropriately changing/tuning a strength of the first magnetic flux).

To facilitate such modulation/tuning of the first magnetic flux, various embodiments of the invention can employ an electromagnet. Specifically, in various aspects, a strength and/or value of the first magnetic flux of the tunable permanent magnet can change based on the tunable permanent magnet being exposed to both an external magnetic field and an electric current. Thus, in various embodiments, an electrode can apply an electric current to the tunable permanent magnet, and an electromagnet can emit a second magnetic flux onto the tunable permanent magnet. In various instances, when the tunable permanent magnet is both exposed to the electric current from the electrode and to the second magnetic flux from the electromagnet, a strength/value (e.g., magnitude and/or orientation) of the first magnetic flux can change, which can correspondingly cause the operational frequency of the qubit device to change. In various embodiments, the first magnetic flux of the tunable permanent magnet can retain this changed strength/value, even after the electrode and the electromagnet are powered down (e.g., even after the electrode removes the electric current and the electromagnet removes the second magnetic flux). As explained above, the changed strength/value of the first magnetic flux of the tunable permanent magnet can cause a corresponding change in the operational frequency of the qubit device.

In various embodiments, the tunable permanent magnet can comprise manganese nanoparticles embedded in a silicon matrix (e.g., about 40% manganese). In various instances, manganese nanoparticles embedded in a silicon matrix can be magnetized when exposed to an electric current in the presence of an external magnetic field. In various aspects, the magnetic properties of the manganese nanoparticles (e.g., the magnitude and/or orientation of the resulting magnetic field/flux generated by the magnetized manganese nanoparticles) can depend upon the magnitude and/or phase of the electric current that is applied to the manganese nanoparticles and upon the magnitude and/or orientation of the external magnetic field to which the manganese nanoparticles are exposed. In various aspects, manganese nanoparticles embedded in a silicon matrix can be tuned in situ to a particular magnetic field strength by passing current through the matrix in the presence of an external magnetic field.

Overall, the tunable permanent magnet can emit a first magnetic flux onto the qubit device (e.g., where the operational frequency of the qubit device is a function of the first magnetic flux), and the electromagnet and electrode can be leveraged to tune the first magnetic flux, which thereby tunes the operational frequency of the qubit device. Therefore, various embodiments of the invention can facilitate flux tuning of the qubit device that does not require sustained and/or actively flowing electric current. Instead, various embodiments of the invention can expend electric current (e.g., by the electrode and the electromagnet) for short periods of time to transition/tune/modulate the first magnetic flux of the tunable permanent magnet, which correspondingly transitions/tunes/modulates the operational frequency of the qubit device. Once the first magnetic flux (and therefore the operational frequency of the qubit device) is transitioned/tuned/modulated as desired, the electrode and electromagnet can be powered down, thereby ceasing the expenditure of electric current. Since the tunable permanent magnet can retain its newly transitioned/tuned/modulated magnetic flux even in the absence of the electric current from the electrode and in the absence of the second magnetic flux from the electromagnet, the tunable permanent magnet can maintain the operational frequency of the qubit device at its newly transitioned/tuned/modulated value without sustained and/or active flowing of electric current Eliminating sustained and/or actively flowing current in this way can, in various cases, reduce excess heating of quantum circuits and improve stability of quantum operational frequencies. Conventional systems/techniques, in stark contrast, implement only electromagnets to facilitate flux tuning, which requires constantly flowing electric current.

In other words, conventional systems/techniques require electric current both to transition/tune the operational frequency of a qubit device and to maintain that transitioned/tuned operational frequency, while various embodiments of the invention require electric current only to transition/tune the operational frequency of the qubit device and can maintain the newly transitioned/tuned operational frequency without the flow of electric current. Thus, various embodiments of the invention constitute a concrete technical improvement over conventional flux tuning systems/techniques.

As a non-limiting, illustrative example, suppose that it is desired to operate a qubit device at z Hz for t units of time (e.g., for any suitable positive numbers z and t). Further, suppose that the qubit device has a base operational frequency of x Hz (e.g., for any suitable positive number x, with x≠z). In various aspects, the tunable permanent magnet can emit a first magnetic flux onto the qubit device. Suppose that the first magnetic flux has an initial strength B (for any suitable number B). In various instances, suppose that the operational frequency of the qubit device shifts from x Hz to y Hz (e.g., for any suitable positive number y, with y≠x≠z) when the qubit device is exposed to a magnetic flux of strength B and that the operational frequency of the qubit device shifts to z Hz when the qubit device is exposed to a magnetic flux of strength B'. Thus, the goal can be to tune the first magnetic flux of the tunable permanent magnet from strength B to strength B'. In various aspects, this can be facilitated by the electrode and the electromagnet. In various instances, the first magnetic flux (e.g., the strength of the first magnetic flux) can be a function of the electric current (e.g., the magnitude and/or phase of the electric current) and the second magnetic flux (e.g., the strength of the second magnetic flux). Thus, in various aspects, the electric current generated by the electrode and the second magnetic flux generated by the electromagnet can be suitably controlled/chosen such that they cause the first magnetic flux of the tunable permanent magnet to shift to strength B'. The electrode and the electromagnet can consume/expend electric current during this process. After the strength of the first magnetic flux is shifted to B', the electrode and the electromagnet can power down (e.g., can cease consuming/expending electric current). In various embodiments, the tunable permanent magnet (e.g., manganese nanoparticles embedded in a silicon matrix) can retain the strength B' even after the electrode and electromagnet power down. Since the qubit device is now exposed to the first magnetic flux having a strength B', the operational frequency of the qubit device can shift to z Hz. The operational frequency of the qubit device can remain at z Hz for as long as the first magnetic flux of the tunable permanent magnet remains at strength B'. Since the first magnetic flux of the tunable permanent magnet can retain the strength B' without expending electric current, the operational frequency of the qubit device can remain at z Hz without expending electric current. Once the t units of time expire, the above process can be repeated for any suitable value to which it is desired to shift the operational frequency of the qubit device.

In stark contrast, conventional systems/techniques would merely emit, by an electromagnet, a magnetic flux of strength B' onto the qubit device (e.g., by choosing a suitable electric current to apply to the electromagnet). This would shift the operational frequency of the qubit device to z Hz. However, in order to maintain the operational frequency of the qubit device at z Hz, the electromagnet must remain powered on for the entire t units of time. That is, the electromagnet can maintain the operational frequency of the qubit device at z Hz only by constantly consuming electric current (e.g., actively flowing electric current) for the entire duration of the t units of time. As mentioned above, such constant flow of electric current can cause undesirable heating of the quantum circuit and/or undesirable instability in the operational frequency of the qubit device. Because various embodiments of the invention can maintain the operational frequency of the qubit device at z Hz without such constant flow of electric current, various embodiments of the invention can avoid the excess heating and/or instability that plague conventional systems/techniques. Thus, various embodiments of the invention constitute a concrete technical improvement in the field of flux tuning.

In various aspects, embodiments of the invention can be implemented as follows. Quantum circuitry can be cooled (e.g., via any suitable refrigeration mechanisms) to operational temperatures (e.g., 20 mK). A current operational frequency of a qubit device can be measured (e.g., via any suitable quantum frequency measurement techniques), and a target operational frequency of the qubit device can be selected. Various embodiments of the invention can be implemented to tune the magnetic flux of a tunable permanent magnet (e.g., manganese nanoparticles embedded in a silicon matrix) to which the qubit device is exposed. Tuning the magnetic flux of the tunable permanent magnet can, as described herein, be facilitated by passing a current through the tunable permanent magnet (e.g., a silicon-manganese nanoparticle film) while the tunable permanent magnet is exposed to an external magnetic field. The electric current and the external magnetic field can be removed once the tunable permanent magnet attains a desired, predetermined, and/or threshold magnetic flux strength. The desired, predetermined, and/or threshold strength of the magnetic flux of the tunable permanent magnet can cause the operational frequency of the qubit device to take on a corresponding, desired, predetermined, and/or threshold value. In various aspects, any suitable number of other qubit devices can be tuned in this fashion. In various instances, the quantum circuitry can then be operated as desired.

In various aspects, a tunable permanent magnet comprising manganese nanoparticles embedded in a silicon matrix can be made/manufactured as follows. In various instances, a suitably-sized trench can be patterned into a silicon wafer. A suitable silicon-manganese film can be deposited into the trench, and chemical-mechanical planarization can be implemented. The silicon-manganese film can be annealed in hydrogen (e.g., $H_2$) to form manganese nanoparticles. In some instances, a superconductor film (e.g., niobium) can be deposited onto the silicon wafer and patterned/etched into wires/electrodes coupled to the silicon-manganese film. In various cases, a qubit device (e.g., aluminum/aluminum oxide/aluminum Josephson Junctions) can be patterned/etched/deposited onto the silicon wafer in proximity to the silicon-manganese film. In various other cases, a qubit device can be patterned/etched/deposited onto a separate substrate.

In various aspects, an electromagnet/flux coil can be made/manufactured as follows. In some instances, a superconductor film (e.g., niobium) can be deposited onto a substrate and can be patterned and etched into a suitable coil shape. In various cases, a dielectric (e.g., silicon or silicon oxide) can be deposited. Suitable vias can then be patterned and etched into the dielectric to provide contact points to the center/inner lead of the coil and an edge/outer lead of the coil. In various aspects, a superconductor (e.g., niobium) can be deposited and then patterned/etched to form wires, one wire contacting the center/inner lead and another wire contacting the edge/outer lead.

In various aspects, a tunable permanent magnet can be patterned in a substrate and bonded, with alignment, to a qubit chip. The field strength of each tunable permanent magnet can be adjusted either during plating deposition (e.g., with an external magnetic field) or by treating the tunable permanent magnet with a localized external magnetic field (e.g., from an electromagnet) after device fabrication. In various aspects, the tunable permanent magnet can comprise a silicon-manganese film (e.g., silicon matrix with manganese nanoparticles). Magnetization of the manganese nanoparticles can be facilitated by passing current through the silicon-manganese film in the presence of an external magnetic field. After magnetization and in the absence of further current or of the external magnetic field, the silicon-manganese film can retain a stable magnetic field strength.

In various aspects, possible non-limiting applications of embodiments of the invention can include: tuning the operational frequencies of qubit devices; providing structures for quasi-particle repulsion from device regions; providing external fields to enable function of 3-5 majorana fermion devices; providing external fields to enable function of NIST magnetic Josephson Junction neuromorphic devices; using a magnet trap to make superconductors into a normal metal at a specific region and trap quasiparticles to improve coherence; and/or in various aspects, measuring device frequency at cryo-temperatures in the absence of the magnetic field, bringing the device to ambient temperatures, adjusting field strength of the tunable permanent magnet as needed, then bringing devices back to cryo-temperatures for operation.

Various embodiments of the invention include novel systems/techniques for facilitating quantum tuning via permanent magnetic flux elements that are not abstract, that are not natural phenomena, that are not laws of nature, and that cannot be performed as a set of mental acts by a human. Instead, various embodiments of the invention include systems/techniques for facilitating flux tuning of a qubit device using tunable permanent magnets that do not require sustained and/or actively flowing electric current. Such sustained and/or actively flowing electric current can cause technical problems in flux tuning, such as excess heating of the quantum circuit and its environment, and/or instability of the operational frequency of the qubit device. Since various embodiments of the invention do not require sustained and/or actively flowing electric current, various embodiments of the invention can eliminate and/or reduce the problems of excess heating and instability that afflict conventional systems/techniques, and thereby constitute concrete technical improvements over the prior art. Various embodiments of the invention can accomplish these technical improvements by emitting, via a tunable permanent magnet, a first magnetic flux onto a qubit device, where an operational frequency of the qubit device is a function of the first magnetic flux. The tunable permanent magnet can emit/generate the first magnetic flux without expending/consuming electric current. Thus, the first magnetic flux can shift an operational frequency of the qubit device to a modulated value and maintain the operational frequency at the modulated value without expending/consuming electric current. In various embodiments, an electrode and an electromagnet can be leveraged to tune the first magnetic flux of the tunable permanent magnet. Specifically, the electrode can apply an electric current to the tunable permanent magnet, and the electromagnet can emit a second magnetic flux onto the tunable permanent magnet. In various embodiments, the first magnetic flux of the tunable permanent magnet (e.g., manganese nanoparticles embedded in a silicon matrix) can be a function of the electric current associated with the electrode and the second magnetic flux associated with the electromagnet. In this way, the electrode and electromagnet can be controlled/leveraged to shift/change the first magnetic flux of the tunable permanent magnet as desired, which can correspondingly shift/change the operational frequency of the qubit device. Based on the first magnetic flux being shifted/changed as desired, the electrode and electromagnet can be powered down (e.g., can stop consuming/expending electric current), and the tunable permanent magnet can retain its newly shifted/changed first magnetic flux. Since the tunable permanent magnet can retain its newly shifted/changed first magnetic flux in the absence of any sustained and/or actively flowing electric current, the tunable permanent magnet can maintain the newly shifted/changed operational frequency of the qubit device without sustained and/or actively flowing electric current. In this way, embodiments of the invention can facilitate flux tuning without sustained and/or actively flowing electric current, which can reduce and/or eliminate the problems of excess heating and/or instability. Thus, embodiments of the invention provide novel systems/techniques for facilitating flux tuning that improve the functioning of quantum computing systems, and thereby constitute concrete technical improvements over the prior art.

In various aspects, it should be appreciated that the figures of this disclosure are exemplary and non-limiting only and are not necessarily drawn to scale.

FIG. 1 illustrates a block diagram of an example, non-limiting system 100 that can facilitate quantum tuning via permanent magnetic flux elements in accordance with one or more embodiments described herein. As shown, in various aspects, the system 100 can comprise a permanent magnet 104, an electromagnet 112, and a qubit device 102. In various instances as described herein, the permanent magnet 104 and the electromagnet 112 can be implemented to facilitate flux tuning of the qubit device 102 without sustained and/or actively flowing electric current (e.g., without consuming/expending electric current for the time period during which it is desired to tune/modulate the operational frequency of the qubit device 102).

In various embodiments, the qubit device 102 can be any suitable qubit device on which flux tuning can be performed. For example, the qubit device 102 can be a SQUID loop (e.g., a superconducting quantum interference device loop), comprising two (or more) Josephson Junctions coupled in parallel. In such case, the overall operational frequency of the SQUID loop can be a function of an external magnetic flux passing through the loop (e.g., passing between the parallel Josephson Junctions). In various embodiments, the qubit device 102 can be any suitable quantum device that functions as a qubit and that has an operational frequency that is a function of and/or is otherwise based on an external magnetic flux to which the qubit device 102 is exposed. In some embodiments, a plurality of qubit devices 102 can be implemented (e.g., in some cases, one permanent magnet 104 can correspond to several qubit devices 102).

As shown, in various embodiments, the permanent magnet 104 can emit a first magnetic flux 106 (e.g., a first magnetic field) onto the qubit device 102. Because the operational frequency of the qubit device 102 can be a function of an external magnetic flux to which the qubit device 102 is exposed, the operational frequency of the qubit device 102 can be based on the first magnetic flux 106 (e.g., the magnitude and/or orientation of the first magnetic flux 106 can control, adjust, shift, change, transition, and/or modulate the operational frequency of the qubit device 102). So, in various aspects, controlling/modulating the first magnetic flux 106 of the permanent magnet 104 can correspondingly control/modulate the operational frequency of the qubit device 102. In various aspects, the permanent magnet 104 can be a tunable permanent magnet. In various instances, the permanent magnet 104 can be a tunable nanoparticle magnet (e.g., comprising manganese nanoparticles embedded in a silicon matrix).

In various embodiments, the permanent magnet 104 can emit, generate, and/or maintain the first magnetic flux 106 without expending, consuming, or otherwise relying on electric current. This is because a permanent magnet can retain its magnetic properties/characteristics even in the absence of an inducing current or field, unlike an electromagnet. Thus, in various instances, the first magnetic flux 106 of the permanent magnet 104 can shift an operational frequency of the qubit device 102 from an initial state to a modulated state, and the first magnetic flux 106 of the permanent magnet 104 can keep/maintain the operational frequency of the qubit device 102 at the modulated state without consuming/expending electric current (e.g., without electric current being applied to the permanent magnet 104).

In various embodiments, the permanent magnet 104 can be a tunable permanent magnet, such as a tunable nanoparticle magnet. In various embodiments, the permanent magnet 104 can comprise manganese nanoparticles embedded in a silicon matrix. In various aspects, manganese nanoparticles that are embedded in a silicon matrix can be tuned in situ to a particular magnetic field strength by passing a current through the matrix in the presence of an external magnetic field. In other words, manganese nanoparticles can, in various instances, be controllably magnetized by applying an electric current to the silicon matrix while the manganese nanoparticles are exposed to an external magnetic field. The resulting magnetic characteristics of the manganese nanoparticles can be functions of the external magnetic field and the electric current (e.g., such that controlling the properties of the electric current that is applied to the manganese nanoparticles and controlling the properties of the external magnetic field to which the manganese nanoparticles are exposed can correspondingly control the resulting magnetic properties of the manganese nanoparticles). In various aspects, the manganese nanoparticles embedded in the silicon matrix can retain its magnetic properties even after the manganese nanoparticles are no longer exposed to the electric current and/or the external magnetic field. Accordingly, in various embodiments, the first magnetic flux 106 of the permanent magnet 104 can, in various instances, be tuned, modulated, and/or controlled by the electromagnet 112 and an electrode 108. In various aspects, the permanent magnet 104 can comprise 40% and/or about 40% manganese. In various aspects, the permanent magnet 104 can comprise between 35% to 50% manganese, inclusively. In various embodiments, the permanent magnet 104 can comprise any suitable proportion/percentage of manganese nanoparticles. In various embodiments, a film containing the manganese nanoparticles embedded in the silicon matrix can be constructed on a module/substrate that is in proximity to the qubit device 102 or can be constructed on the same chip/substrate as the qubit device 102.

In various embodiments, as shown, the permanent magnet 104 can be coupled to an electrode 108. As explained herein, the electrode 108 can be leveraged with the electromagnet 112 to tune, modulate, and/or control the first magnetic flux 106 of the permanent magnet 104. As shown, the electrode 108 can, in some cases, have a positive lead (e.g., denoted with "+" in FIG. 1) and a negative lead (e.g., denoted with "−" in FIG. 1). In various instances, the electrode 108 can apply an electric current 110 to the permanent magnet 104 (e.g., the electric current 110 can flow through the electrode 108, from the positive lead to the negative lead). As explained above, once magnetized, the permanent magnet 104 can emit the first magnetic flux 106 without expending/consuming electric current. Thus, the electrode 108 need not apply the electric current 110 to the permanent magnet 104 in order to maintain and/or continuously emit the first magnetic flux 106 (e.g., after magnetization, the permanent magnet 104 can output the first magnetic flux 106 even when the electrode 108 is powered down such that no electric current 110 is applied to the permanent magnet 104).

In various embodiments, as shown, the electromagnet 112 (e.g., a flux coil) can emit a second magnetic flux 114 (e.g., a second magnetic field) onto the permanent magnet 104. As described herein, the permanent magnet 104 can emit the first magnetic flux 106. In various embodiments, the first magnetic flux 106 of the permanent magnet 104 can be tuned, modulated, and/or controlled by passing electric current (e.g., electric current 110) through the permanent magnet 104 while the permanent magnet 104 is in the presence of an external magnetic field (e.g., the second magnetic flux 114). So, in various cases, controlling/modulating the properties/characteristics of the electric current 110 and the properties/characteristics of the second magnetic flux 114 can correspondingly control/modulate the properties/characteristics of the first magnetic flux 106. In various aspects, the electromagnet 112 can be supplemented by another magnet (e.g., another electromagnet or another permanent magnet) in order to ensure that the second magnetic flux 114 is sufficiently strong to change/control/tune the permanent magnet 104.

Because an electromagnet can emit/generate a magnetic field only in the presence of an inducing current or field, the electromagnet 112 can, in various instances, be coupled to an electrode 116, as shown. In various cases, the electrode 116 can have a positive lead (e.g., denoted by a "+" in FIG. 1) and a negative lead (e.g., denoted by a "−" in FIG. 1). In various instances, the electrode 116 can apply an electric current 118 to the electromagnet 112 (e.g., the electric current 118 can flow through the electrode 116, from the positive lead to the negative lead). In various aspects, the electric current 118 can flow in order for the electromagnet 112 to emit the second magnetic flux 114 (e.g., the electromagnet 112 can consume/expend electricity in order to generate the second magnetic flux 114). In various instances, controlling/modulating the properties/characteristics of the electric current 118 can correspondingly control/modulate the properties/characteristics of the second magnetic flux 114.

Overall, the permanent magnet 104 can emit the first magnetic flux 106 onto the qubit device 102. Since the operational frequency of the qubit device 102 can be a function of the properties/characteristics (e.g., magnitude and/or orientation) of the first magnetic flux 106, the first magnetic flux 106 can cause the operational frequency of the qubit device 102 to shift to a modulated value (e.g., controlling the properties of the first magnetic flux 106 can correspondingly control the operational frequency of the qubit device 102). In various aspects, once magnetized, the permanent magnet 104 can emit the first magnetic flux 106 without consuming/expending electricity (e.g., the electrode 108 can be powered down so that no electric current 110 is flowing; and the electrode 116 can be powered down so that no electric current 118 is flowing, which can cause the electromagnet 112 to not emit the second magnetic flux 114). Thus, the first magnetic flux 106 of the permanent magnet 104 can maintain/keep the operational frequency of the qubit device 102 at the modulated value for a given time period without requiring electric current to actively flow or to be sustained for that given time period. In various cases, it can be desirable to shift the operational frequency of the qubit device 102 to a different modulated value. In various aspects, the electrode 108 and the electromagnet 112 can be used to facilitate this shift. As explained above, in various embodiments, the first magnetic flux 106 of the permanent magnet 104 can be controllably tuned, modulated, and/or changed by applying an electric current (e.g., electric current 110) to the permanent magnet 104 while the permanent magnet 104 is exposed to an external magnetic field (e.g., second magnetic flux 114). Accordingly, the electrode 108 can apply the electric current 110 to the permanent magnet 104, and the electromagnet 112 can emit the second magnetic flux 114 onto the permanent magnet 104 (e.g., which can be facilitated by the electrode 116 applying the electric current 118 to the electromagnet 112). As explained herein, the first magnetic flux 106 can be a function of the electric current 110 and the second magnetic flux 114 (e.g., the magnitude and/or orientation of the first magnetic flux 106 can be controlled by controlling the magnitude and/or phase of the electric current 110 and the magnitude and/or orientation of the second magnetic flux 114). Once the first magnetic flux 106 is appropriately tuned/changed, the electrode 108 can be powered down and the electromagnet 112 can be powered down, and the first magnetic flux 106 can retain its newly tuned/changed properties. In various cases, the newly tuned/changed properties of the first magnetic flux 106 can cause the operational frequency of the qubit device 102 to shift to the different modulated value. In various cases, the first magnetic flux 106 of the permanent magnet 104 can maintain the operational frequency of the qubit device 102 at this different modulated value without expending/consuming electricity (e.g., the electrode 108 and the electromagnet 112 can be powered down).

In this way, the system 100 can expend/consume electric current (e.g., via the electrode 108 and the electromagnet 112) to controllably transition the operational frequency of the qubit device 102 from one value to another, and the system 100 can maintain/sustain the operational frequency of the qubit device 102 (e.g., via the permanent magnet 104) at this new value without expending/consuming electric current (e.g., without actively flowing electric current). In stark contrast, conventional systems/techniques for facilitating flux tuning require the consumption/expenditure of electric current both to transition the operational frequency of the qubit device 102 from one value to another and to maintain the operational frequency of the qubit device 102 at that new value (e.g., actively flowing current is required to maintain the operational frequency at the new value). Since various embodiments of the invention can facilitate flux tuning without continuously flowing electric current for the entire duration during which it is desired to maintain the operational frequency of the qubit device 102 at a new value, various embodiments of the invention do not experience the excess heating or the instability that detrimentally affect conventional systems/techniques.

To help illustrate the above principles, consider the following non-limiting example. Suppose that the first magnetic flux 106 of the permanent magnet 104 has an initial strength of $B_1$ (for any suitable positive number $B_1$). Further, suppose that the operational frequency of the qubit device 102 shifts to $f_1$ (for any suitable positive number $f_1$) when the qubit device 102 is exposed to a magnetic field of strength $B_1$. Thus, the first magnetic flux 106 can cause the operational frequency of the qubit device 102 to take on the value $f_1$. As explained, the permanent magnet 104 can emit the first magnetic flux 106 without expending/consuming electric current (e.g., the electrode 108 and the electromagnet 112 need not be powered on for the permanent magnet 104 to continuously output the first magnetic flux 106). So, the permanent magnet 104 can maintain the operational frequency of the qubit device 102 at $f_1$ for any suitable time period without expending/consuming electric current. Now, suppose that it is desired to shift the operational frequency of the qubit device 102 to $f_2$ (for any suitable positive number $f_2$), and suppose that the operational frequency of the qubit device 102 shifts to $f_2$ when the qubit device 102 is exposed to a magnetic field of strength $B_2$ (for any suitable positive number $B_2$). To facilitate this shift in operational frequency, the electrode 108 and the electromagnet 112 can be implemented to shift the strength of the first magnetic flux 106 to $B_2$. Specifically, the electrode 108 can be powered on to apply the electric current 110 to the permanent magnet 104, and the electromagnet 112 can be powered on (e.g., via the electrode 116 and the electric current 118) to emit the second magnetic flux 114 onto the permanent magnet 104. In various instances, the properties/characteristics of the electric current 110 and the second magnetic flux 114 can be suitably chosen and/or controlled so that they cause the first magnetic flux 106 to take on a strength of $B_2$. Once the strength of the first magnetic flux 106 shifts to $B_2$, the electrode 108 and the electromagnet 112 can power down (e.g., such that the permanent magnet 104 is no longer exposed to the electric current 110 or to the second magnetic flux 114). In various aspects, the first magnetic flux 106 can retain the strength $B_2$ even in the absence of the electric current 110 and of the second magnetic flux 114 (e.g., the permanent magnet 104 can comprise manganese nanoparticles embedded in a silicon matrix). In various instances, the first magnetic flux 106 having strength $B_2$ can cause the operational frequency of the qubit device to shift to $f_2$. Since the first magnetic flux 106 can retain the strength $B_2$ without consuming/expending electric current, the permanent magnet 104 can keep the operational frequency of the qubit device 102 at $f_2$ for any suitable time period without sustained and/or actively flowing electric current. Conventional systems/techniques, on the other hand, would merely use an electromagnet to emit a magnetic flux of strength $B_2$ onto the qubit device 102. Although this would shift the operational frequency of the qubit device 102 to $f_2$, it would require that electric current constantly flow for the entire time period during which it is desired to keep the operational frequency at $f_2$ (e.g., the electromagnet would cease emitting the magnetic flux in the absence electric current).

In this way, various embodiments of the invention can facilitate flux tuning of the qubit device 102 without requiring that electric current constantly flow for the entire duration of the flux tuning. Conventional systems/techniques, in contrast, rely only on electromagnets and thus require that current flow constantly for the entire duration of the flux tuning. As explained above, this can cause excess heating and instability. Various embodiments of the invention eliminate the need for such sustained and/or actively flowing current, which results in less of such excess heating and instability. Various embodiments of the invention thus solve technical problems in the prior art, and therefore constitute concrete technical improvements in the field of flux tuning.

In various embodiments, an apparatus can comprise a nanoparticle magnet (e.g., 104) that emits a tunable permanent magnetic field (e.g., 106). In various aspects, an operational frequency of a Josephson Junction device (e.g., 102) can be based on the tunable permanent magnetic field. In various instances, the apparatus can further comprise a flux coil (e.g., 112) that can tune the tunable permanent magnetic field. In various embodiments, the nanoparticle magnet can comprise manganese nanoparticles embedded in a silicon matrix. In various embodiments, the apparatus can further comprise an electrode (e.g., 108) that can apply a current (e.g., 110) to the nanoparticle magnet as the nanoparticle magnet is exposed to a magnetic field (e.g., 114) of the flux coil. This can thereby change a value of the tunable permanent magnetic field. In various embodiments, the electrode can remove the electric current and the flux coil can remove the magnetic field based on the tunable permanent magnetic field attaining a threshold value.

In various aspects, embodiments of the invention can be implemented to flux tune arrays of qubit devices 102. For instance, if a quantum circuit includes an m-by-n array (for any suitable positive integers m and n) of qubit devices 102 on a substrate, a corresponding m-by-n array of permanent magnets 104 and a corresponding m-by-n array of electromagnets 112 can be implemented to tune the m-by-n array of qubit devices 102.

In various aspects, the qubit device 102, the permanent magnet 104, and/or the electromagnet 112 can be disposed in any suitable physical configuration such that the permanent magnet 104 can electromagnetically interact with the qubit device 102 and such that the electromagnet 112 can electromagnetically interact with the permanent magnet 104.

Figure 2:
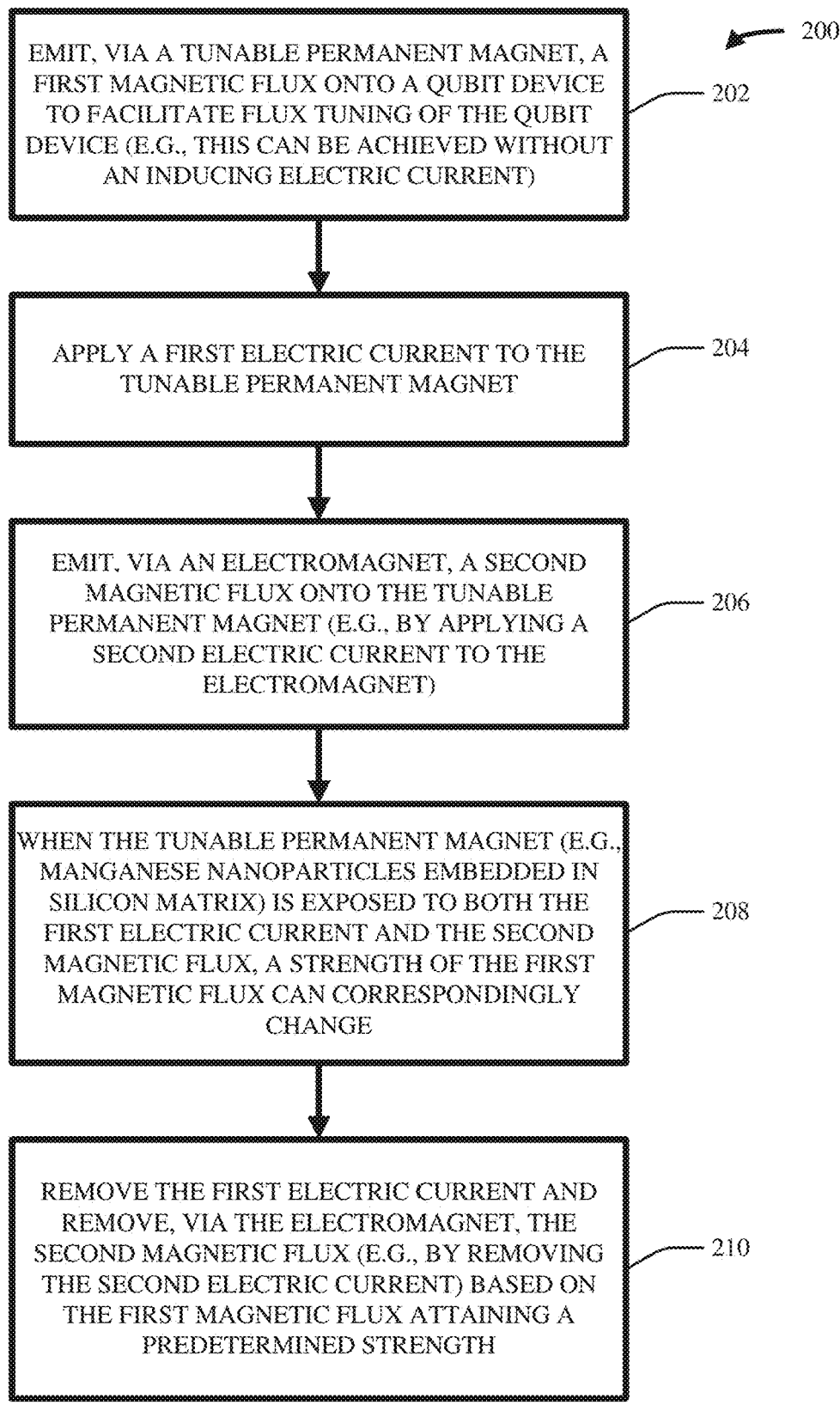
FIG. 2 illustrates a flow diagram of an example, non-limiting method of facilitating quantum tuning via permanent magnetic flux elements in accordance with one or more embodiments described herein.

FIG. 2 illustrates a flow diagram of an example, non-limiting method 200 of facilitating quantum tuning via permanent magnetic flux elements in accordance with one or more embodiments described herein. In various aspects, the method 200 can be facilitated by the system 100.

In various embodiments, act 202 can include emitting, via a tunable permanent magnet (e.g., 104), a first magnetic flux (e.g., 106) onto a qubit device (e.g., 102) to facilitate flux tuning of the qubit device. In various cases, this can be facilitated without an inducing electric current (e.g., the electrode 108 and the electromagnet 112 can be powered down) because the tunable permanent magnet does not require an inducing electric current in order to emit a magnetic flux.

In various aspects, act 204 can include applying (e.g., via the electrode 108) a first electric current (e.g., 110) to the tunable permanent magnet.

In various instances, act 206 can include emitting, via an electromagnet (e.g., 112), a second magnetic flux (e.g., 114) onto the tunable permanent magnet. In various cases, this can be facilitated by applying a second electric current (e.g., 118) via a second electrode (e.g., 116) to the electromagnet.

In various embodiments and as illustrated in act 208, when the tunable permanent magnet is exposed to both the first electric current and the second magnetic flux, a strength of the first magnetic flux can correspondingly change. In various aspects, the tunable permanent magnet can comprise manganese nanoparticles embedded in a silicon matrix, since manganese nanoparticles embedded in a silicon matrix can be controllably magnetized by applying an electric current to the silicon matrix in the presence of an external magnetic field.

In various aspects, act 210 can include removing (e.g., via the electrode 108) the first electric current and removing, via the electromagnet, the second magnetic flux based on the first magnetic flux attaining a predetermined, threshold, and/or desired strength. In various aspects, the electromagnet removing the second magnetic flux can be facilitated by removing the second electric current.

FIGS. 3-7 illustrate block diagrams of example, non-limiting intermediate structures including manganese nanoparticles embedded in a silicon matrix that can be used to facilitate quantum tuning via permanent magnetic flux elements in accordance with one or more embodiments described herein. That is, FIGS. 3-7 depict, at an exemplary and high level, how a tunable permanent magnet (e.g., 102) can be made via manganese nanoparticles embedded in a silicon matrix. It should be appreciated that FIGS. 3-7 are exemplary and non-limiting only. Various well-known details regarding patterning, deposition, etching, planarization, annealing, and/or any other aspect of superconductor and/or semiconductor fabrication are omitted for sake of brevity.

Figure 3:
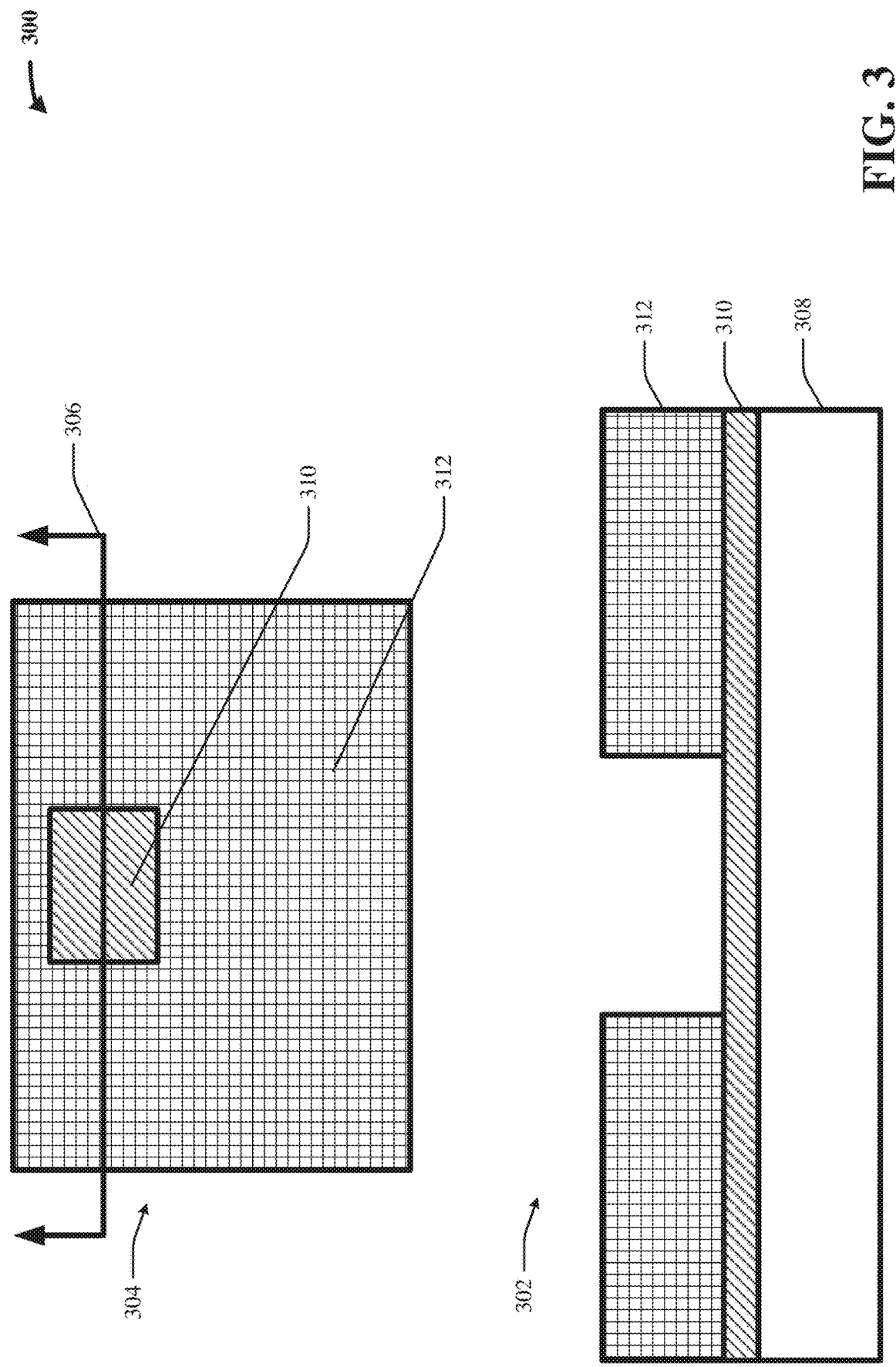
FIGS. 3-7 illustrate block diagrams of example, non-limiting intermediate structures including manganese nanoparticles embedded in a silicon matrix that can be used to facilitate quantum tuning via permanent magnetic flux elements in accordance with one or more embodiments described herein.

FIG. 3 illustrates a profile view 302 of an initial substrate structure and a corresponding top view 304 of the initial substrate structure. The profile view 302 is taken at the cross-section 306. As shown, the fabrication process can begin with a substrate 308. The substrate 308 can comprise silicon, sapphire, and/or any other suitable wafer material. As shown, a silicon oxide polish stop 310 can be deposited on the substrate 308. In various aspects, the silicon oxide polish stop 310 can instead comprise titanium, titanium nitride, copper to facilitate easier plating, and/or any other suitable materials. As shown, a resist layer 312 can be deposited on the silicon oxide polish stop 310 and can be patterned to create any suitably-shaped trench. In the example shown in FIG. 3, a rectangular trench pattern is shown in the top view 304.

Figure 4:
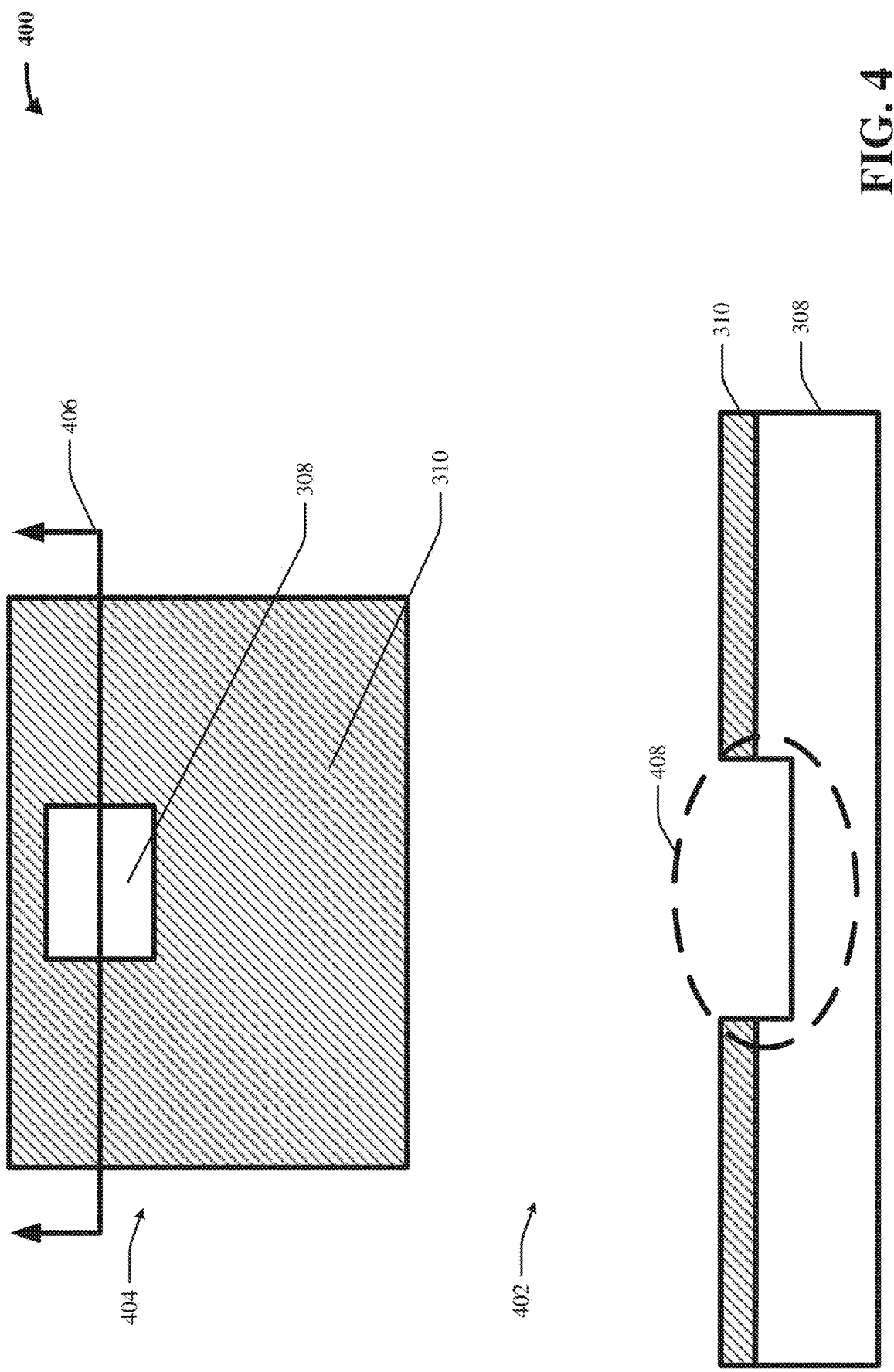

FIG. 4 illustrates a profile view 402 of an intermediate substrate structure (e.g., continuing from FIG. 3) and a corresponding top view 404 of the intermediate substrate structure. The profile view 402 is taken at the cross-section 406. As shown, reactive ion etching (e.g., and/or any other suitable etching technique) can be implemented to etch a trench 408 into the substrate 308. Additionally, the resist layer 312 can be stripped.

Figure 5:
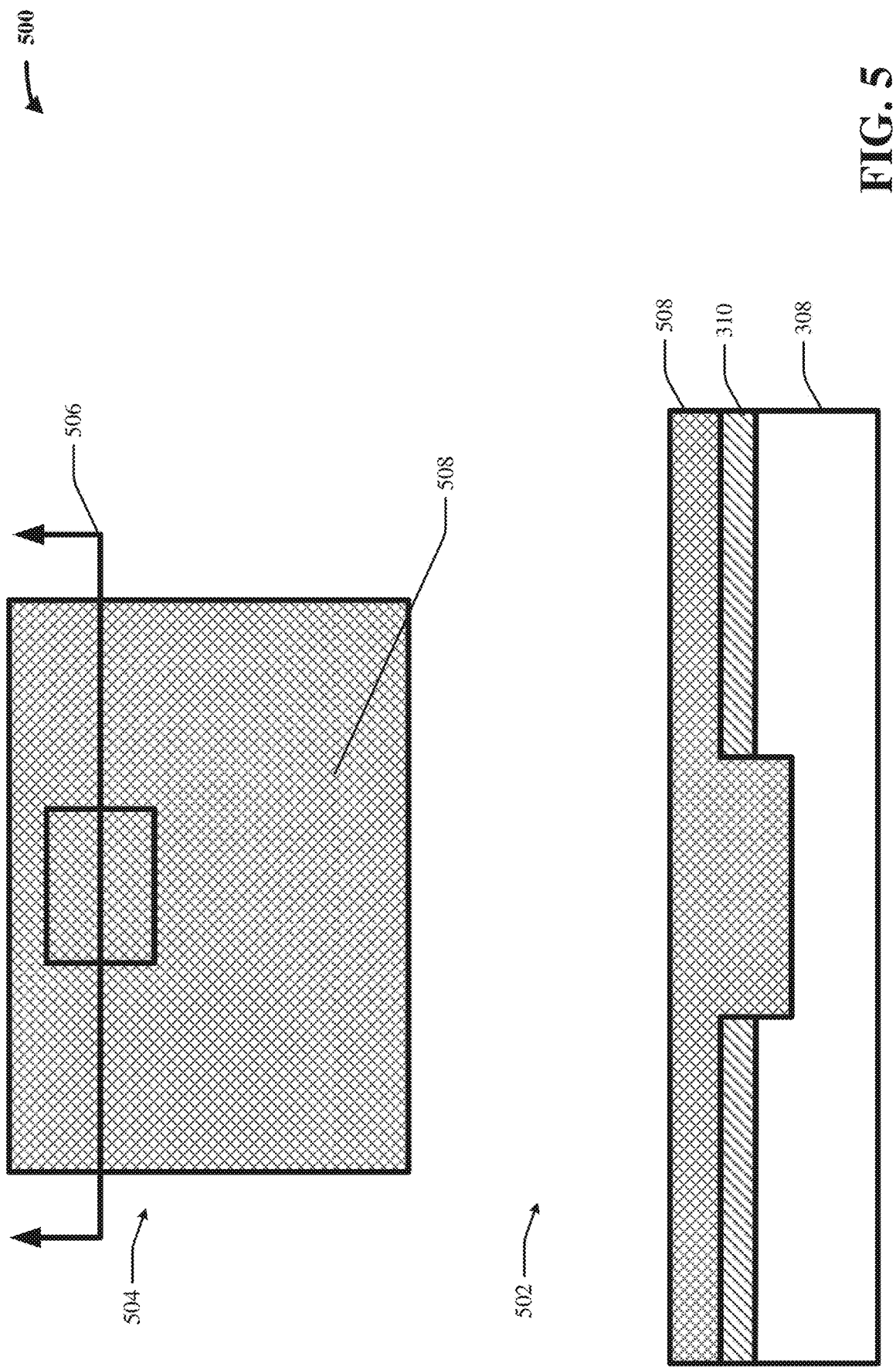

FIG. 5 illustrates a profile view 502 of an intermediate substrate structure (e.g., continuing from FIG. 4) and a corresponding top view 504 of the intermediate substrate structure. The profile view 502 is taken at the cross-section 506. As shown, a silicon-manganese film 508 can be deposited (e.g., by co-evaporation) onto the intermediate substrate structure and into the trench 408. In various instances, the silicon-manganese film 508 can be a doped poly silicon with added manganese. In various aspects, the silicon-manganese film can comprise approximately 40% manganese. In various other aspects, the silicon-manganese film can comprise approximately 50% manganese. In various other instances, any suitable percentage of manganese can be implemented.

Figure 6:
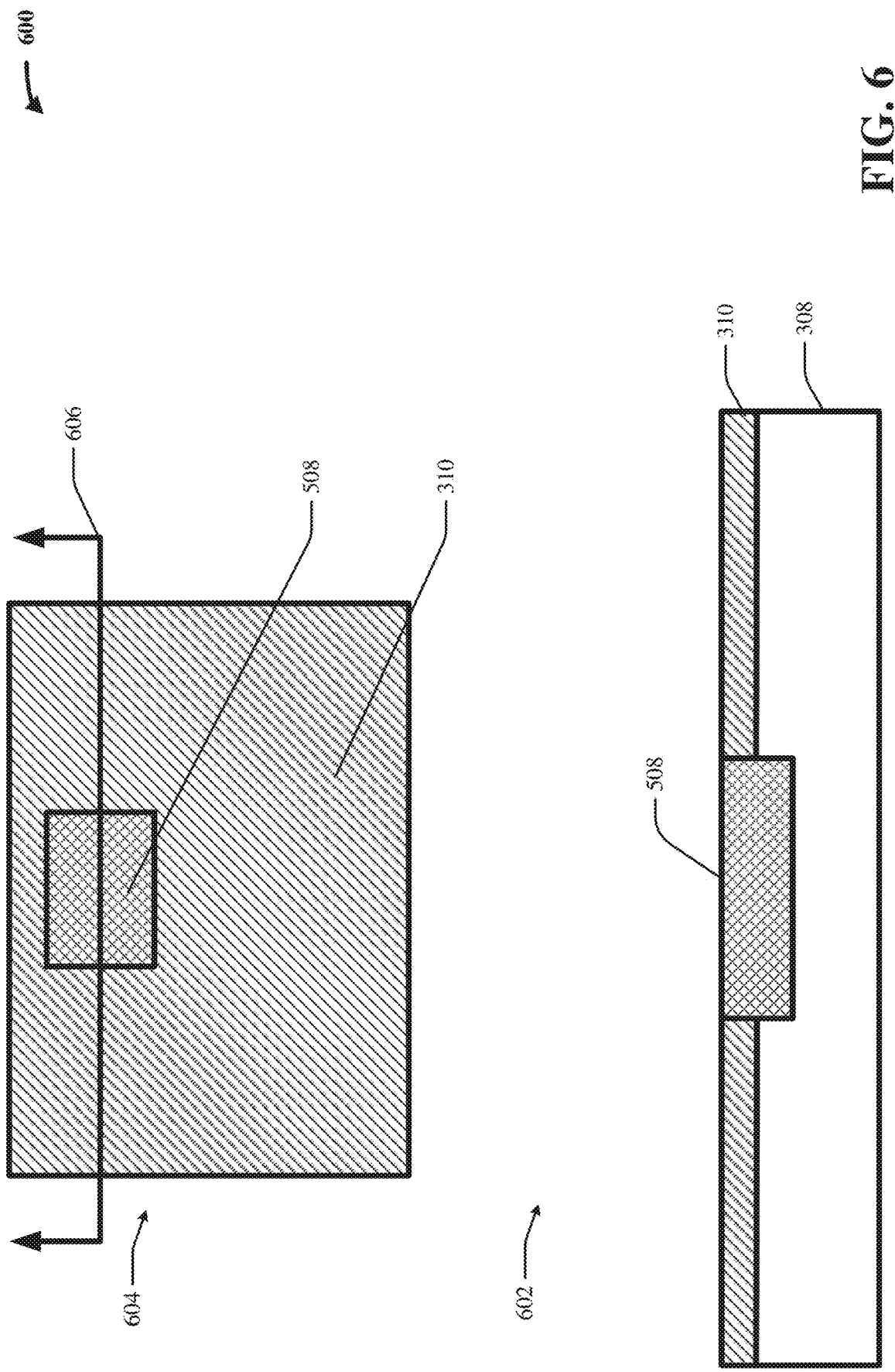

FIG. 6 illustrates a profile view 602 of an intermediate substrate structure (e.g., continuing from FIG. 5) and a corresponding top view 604 of the intermediate substrate structure. The profile view 602 is taken at the cross-section 606. As shown, chemical-mechanical polishing and/or chemical-mechanical planarization can be implemented to remove portions of the silicon-manganese film 508 that are above the silicon oxide polish stop 310. The result can be that the silicon-manganese film 508 is located in the trench 408. In various embodiments, the intermediate substrate structure can be annealed at 400 degrees Celsius in hydrogen (e.g., $H_2$). In various aspects, this annealing can cause the manganese in the silicon-manganese film 508 to agglomerate into manganese nanoparticles. In various aspects, any suitable annealing temperature can be implemented.

Figure 7:
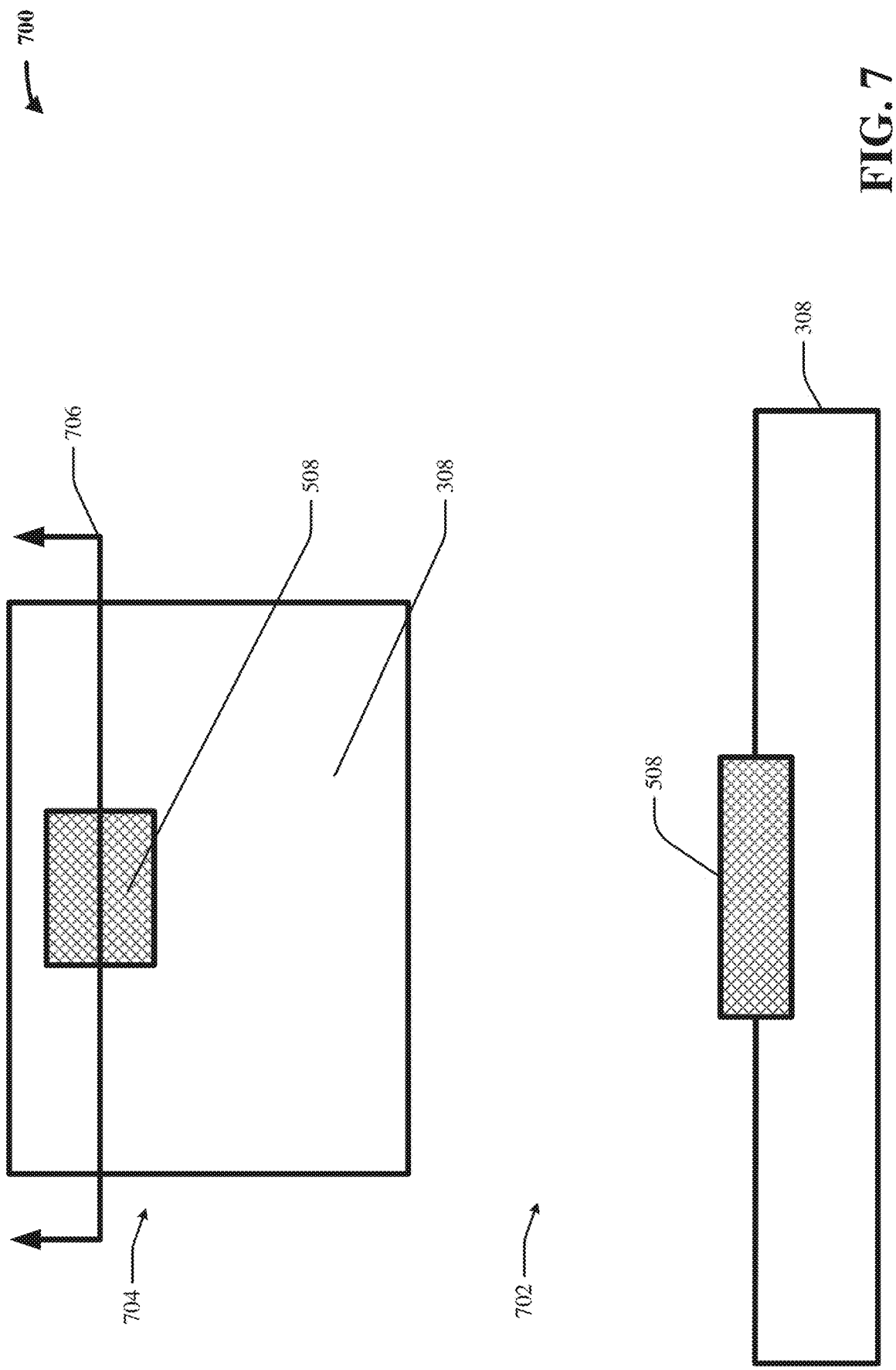

FIG. 7 illustrates a profile view 702 of an intermediate substrate structure (e.g., continuing from FIG. 6) and a corresponding top view 704 of the intermediate substrate structure. The profile view 702 is taken at the cross-section 706. As shown, the silicon oxide polish stop 310 can be stripped (e.g., via dilute hydrofluoric acid (DHF) dip), which can also, in some cases, remove possible metallic contamination in the silicon oxide polish stop 310.

In various aspects, the result of the above operations can be the formation of a silicon-manganese film 508 occupying the trench 408, with the silicon-manganese film 508 comprising manganese nanoparticles. The manganese nanoparticles can be magnetized (as explained above) by applying an electric current (e.g., 110) to the silicon-manganese film 508 while the silicon-manganese film 508 is exposed to and/or otherwise in the presence of an external magnetic field (e.g., 114). Once magnetized by the electric current and the external magnetic field, the silicon-manganese film 508 in the trench 408 can emit its own magnetic field (e.g., 106). In various embodiments, the magnetic properties of the manganese nanoparticles can be controlled by controlling the electric current and the external magnetic field to which the silicon-manganese film 508 is exposed. In various aspects, the magnetic properties of the manganese nanoparticles can be reset by running the electric current in (e.g., along and/or parallel to) the axis of the external magnetic field.

FIGS. 8-14 illustrate block diagrams of example, non-limiting intermediate structures including a qubit device that can be used to facilitate quantum tuning via permanent magnetic flux elements in accordance with one or more embodiments described herein. That is, FIGS. 8-14 depict, at an exemplary and high level, how a qubit device 102 can be formed. Although FIGS. 8-14 illustrate how the qubit device 102 can be formed on the same substrate as the silicon-manganese film 508 (e.g., on the same substrate as the permanent magnet 104), it should be appreciated that the herein described fabrication operations can be implemented to form the qubit device 102 on any suitable separate substrate. It should be appreciated that FIGS. 8-14 are exemplary and non-limiting only. Various well-known details regarding patterning, deposition, etching, planarization, annealing, and/or any other aspect of superconductor and/or semiconductor fabrication are omitted for sake of brevity.

Figure 8:
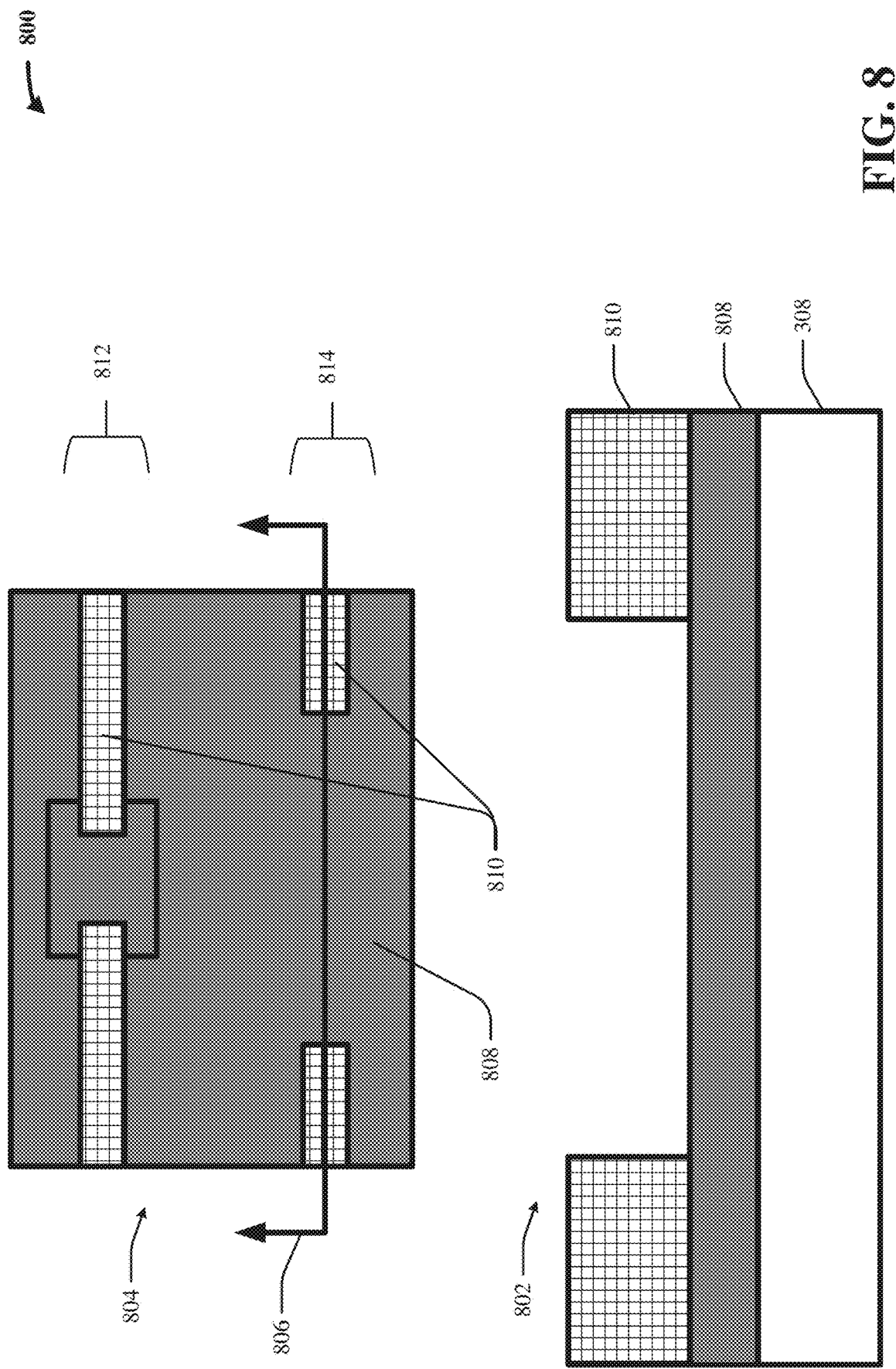
FIGS. 8-14 illustrate block diagrams of example, non-limiting intermediate structures including a qubit device that can be used to facilitate quantum tuning via permanent magnetic flux elements in accordance with one or more embodiments described herein.

FIG. 8 illustrates a profile view 802 of an intermediate substrate structure (e.g., continuing from FIG. 7) and a corresponding top view 804 of the intermediate substrate structure. The profile view 802 is taken at the cross-section 806. As shown, a superconductor 808 (e.g., niobium, vanadium, tantalum, tantalum nitride, tungsten, titanium, titanium nitride, and/or any other suitable superconductor material) can be deposited on the substrate 308 (and can cover the silicon-manganese film 508), and a resist layer 810 can be deposited on the superconductor 808. As shown in the top view 804, the resist layer 810 can be patterned to form two sets of suitably-shaped wires (e.g., electrodes): a first pattern for a first set of wires 812 that correspond to the silicon-manganese film 508, and a second pattern for a second set of wires 814.

Figure 9:
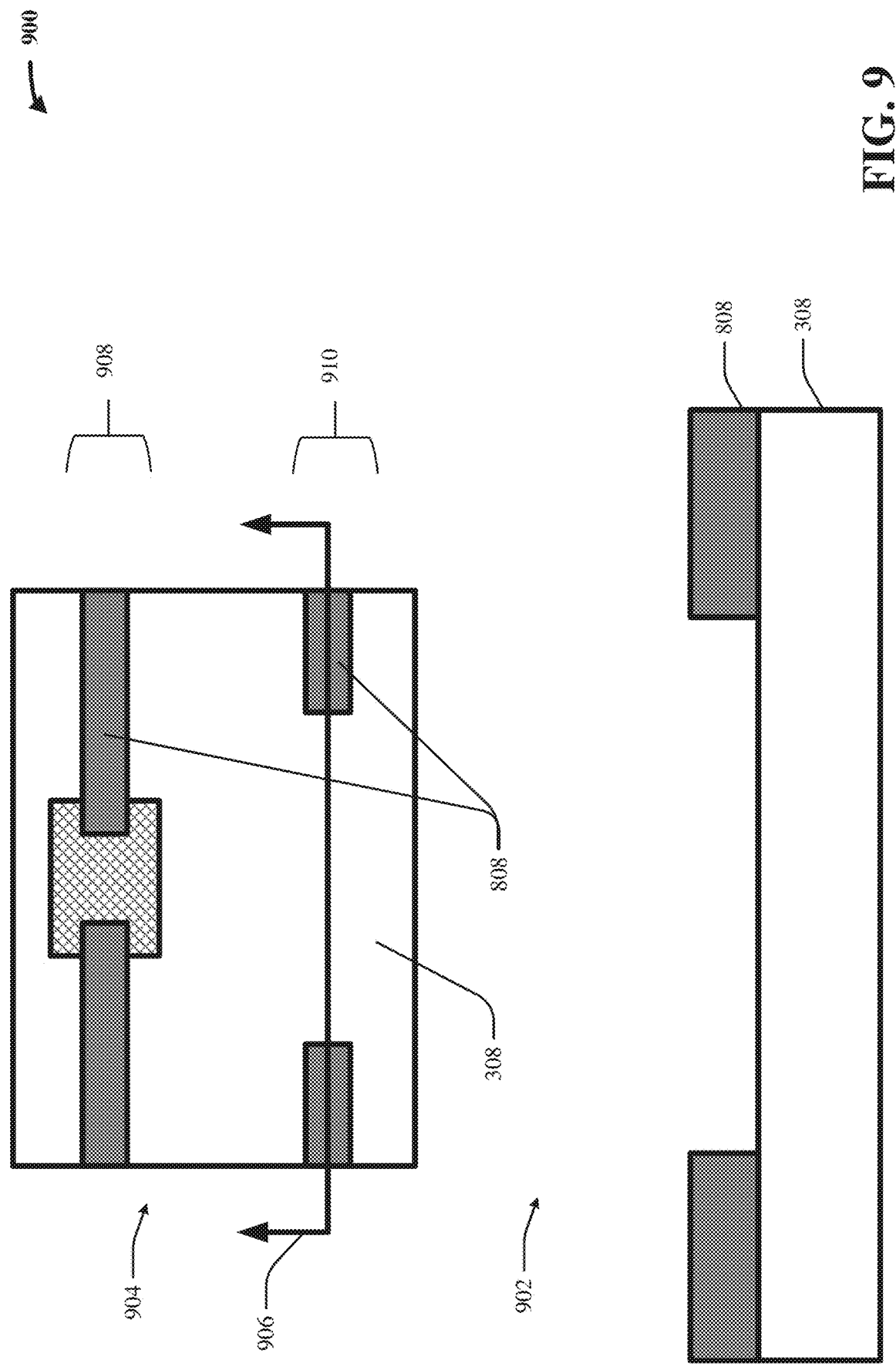

FIG. 9 illustrates a profile view 902 of an intermediate substrate structure (e.g., continuing from FIG. 8) and a corresponding top view 904 of the intermediate substrate structure. The profile view 902 is taken at the cross-section 906. As shown, reactive ion etching can be implemented to etch the superconducting wires 908 and the superconducting wires 910, and the resist layer 810 can be stripped. As shown, the result can be that the silicon-manganese film 508 can have a pair of superconducting wires 908 (e.g., electrodes). As also shown, there can be a second pair of superconducting wires 910 on the substrate 308, which can be used to form the qubit device 102.

Figure 10:
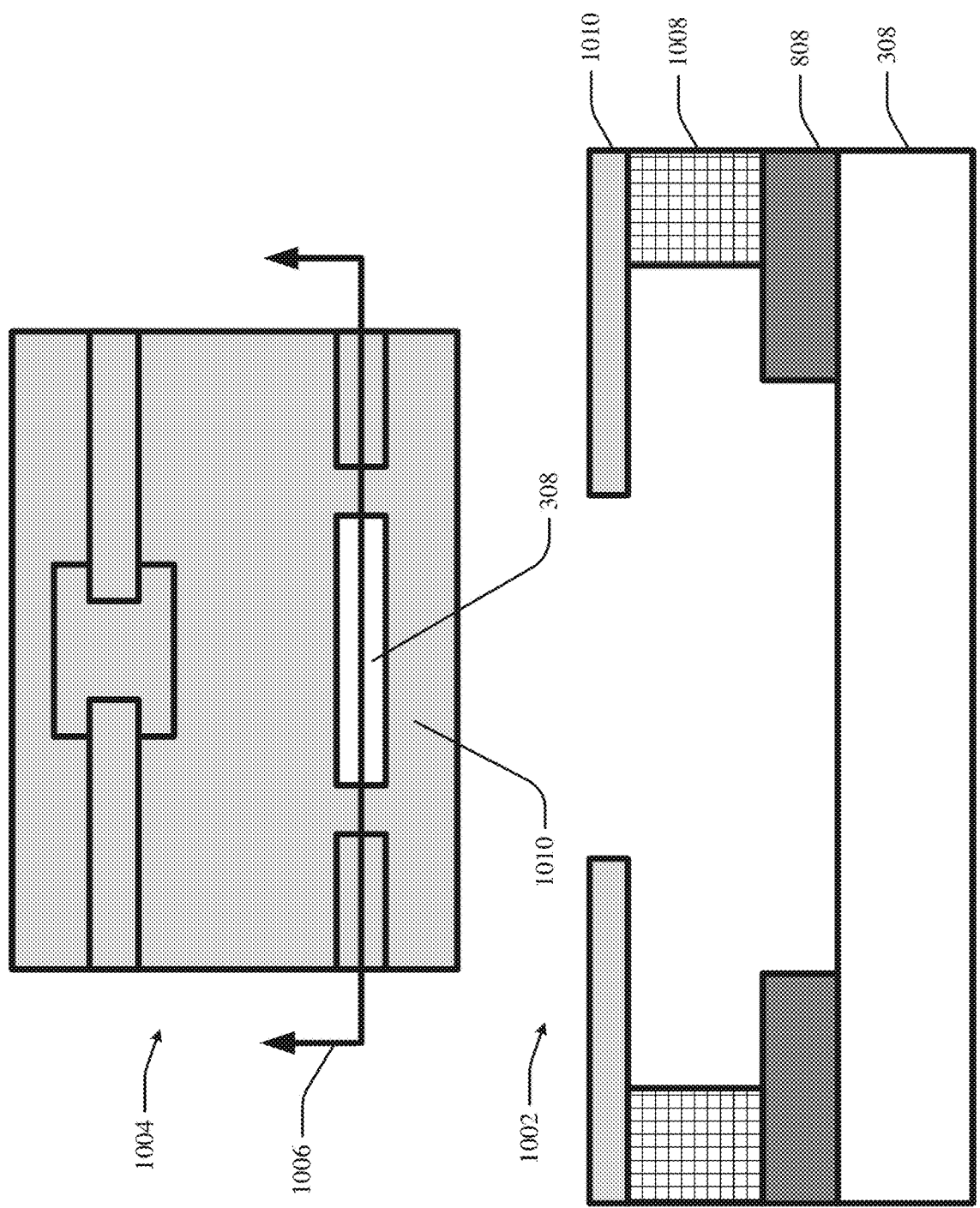

FIG. 10 illustrates a profile view 1002 of an intermediate substrate structure (e.g., continuing from FIG. 9) and a corresponding top view 1004 of the intermediate substrate structure. The profile view 1002 is taken at the cross-section 1006. As shown, a lift-off resist layer 1008 can be deposited on the intermediate substrate structure, and photoresist/hardmask layer 1010 can be deposited on the lift-off resist layer 1008. In various aspects, the lift-off resist layer 1008 and the photoresist/hardmask layer 1010 can be used to facilitate fabrication of the qubit device 102 (e.g., via double-angle evaporation).

Figure 11:
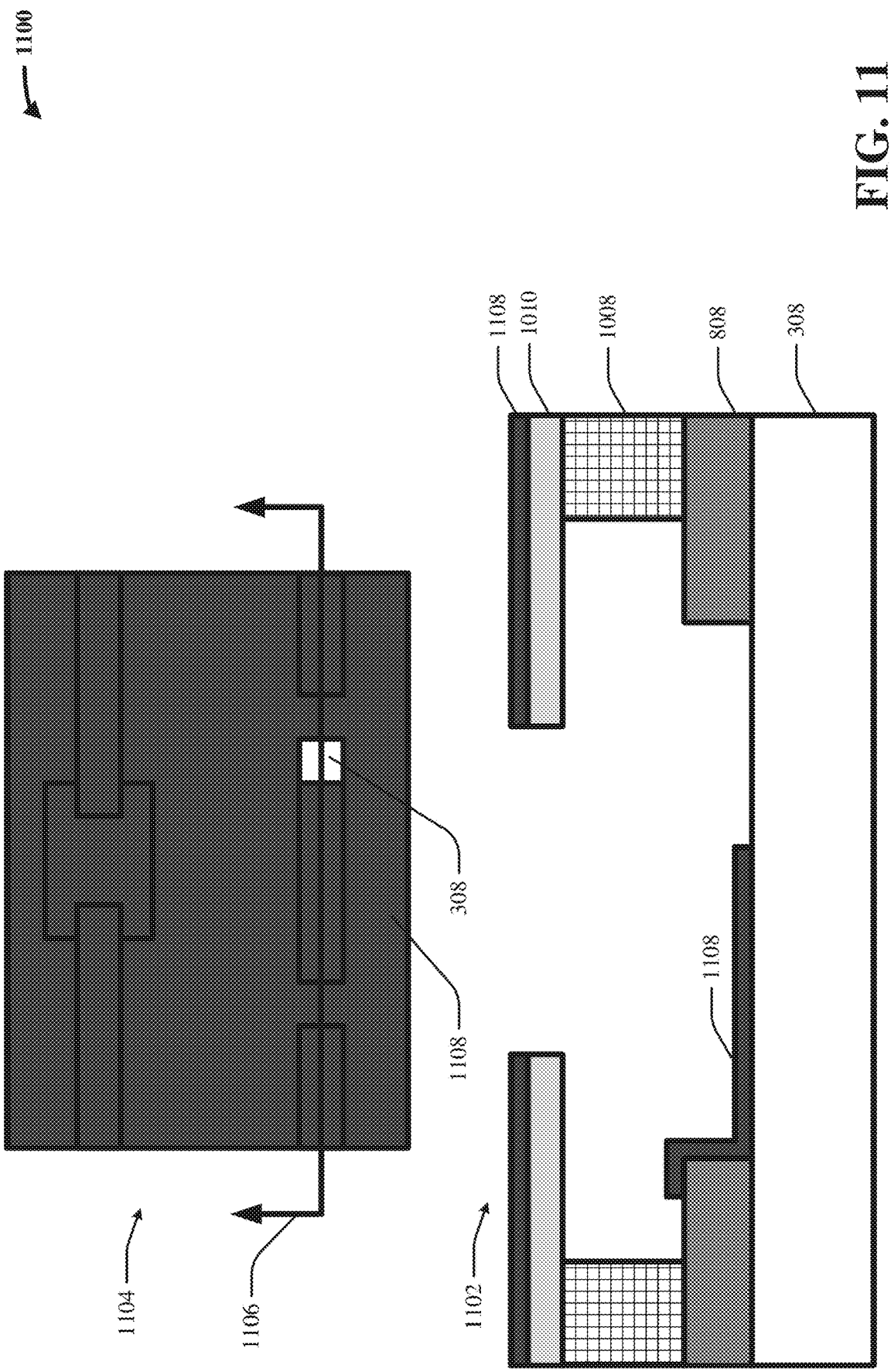

FIG. 11 illustrates a profile view 1102 of an intermediate substrate structure (e.g., continuing from FIG. 10) and a corresponding top view 1104 of the intermediate substrate structure. The profile view 1102 is taken at the cross-section 1106. In various aspects, double-angle evaporation can be facilitated. Specifically, in various aspects, a Josephson Junction electrode layer 1108 (e.g., aluminum, and/or any other suitable Josephson Junction material) can be deposited at a first angle (e.g., from top right to bottom left in FIG. 11).

Figure 12:
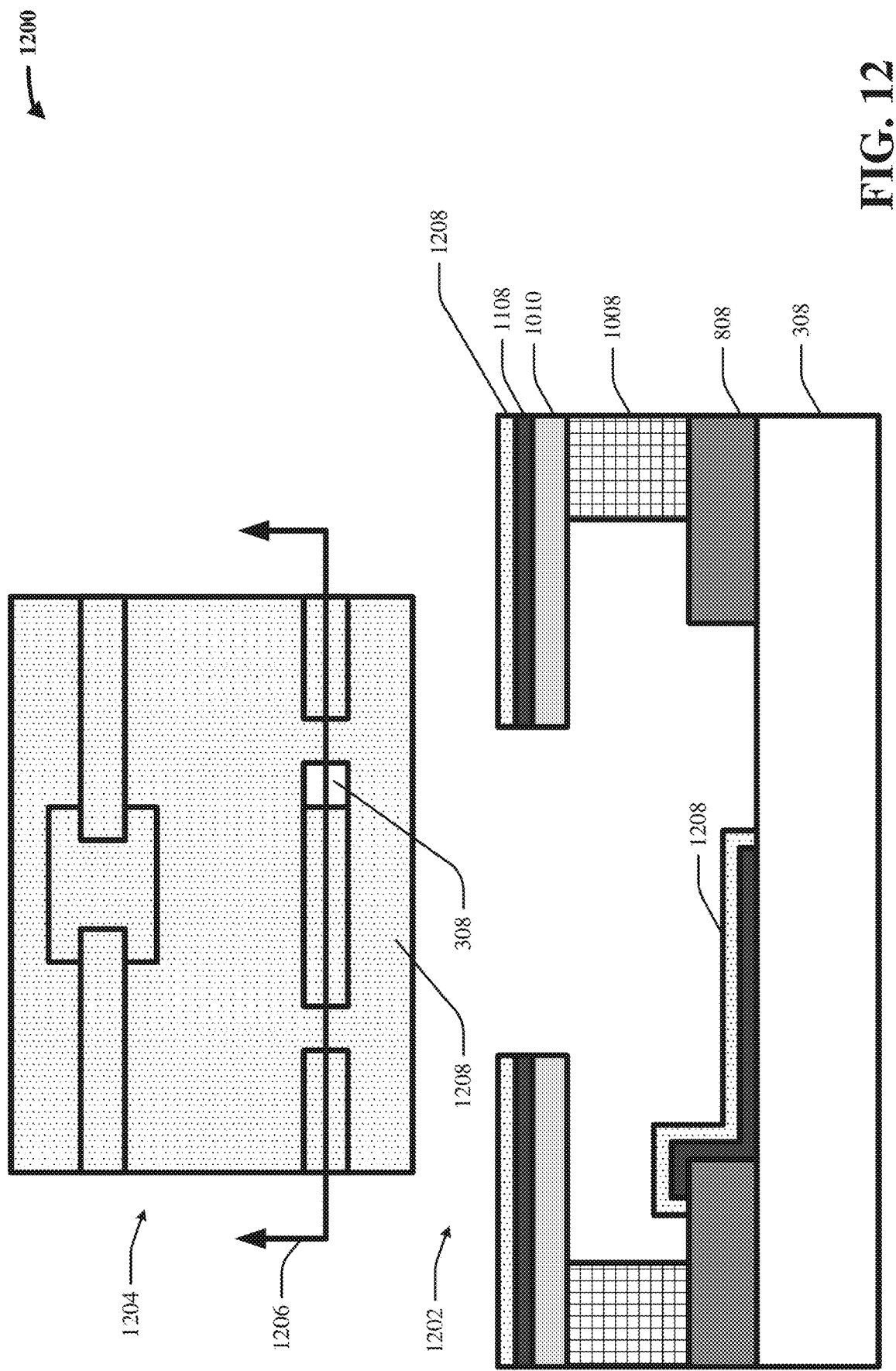

FIG. 12 illustrates a profile view 1202 of an intermediate substrate structure (e.g., continuing from FIG. 11) and a corresponding top view 1204 of the intermediate substrate structure. The profile view 1202 is taken at the cross-section 1206. As shown, the Josephson Junction electrode layer 1108 can be oxidized, resulting in the oxidized layer 1208 (e.g., aluminum oxide).

Figure 13:
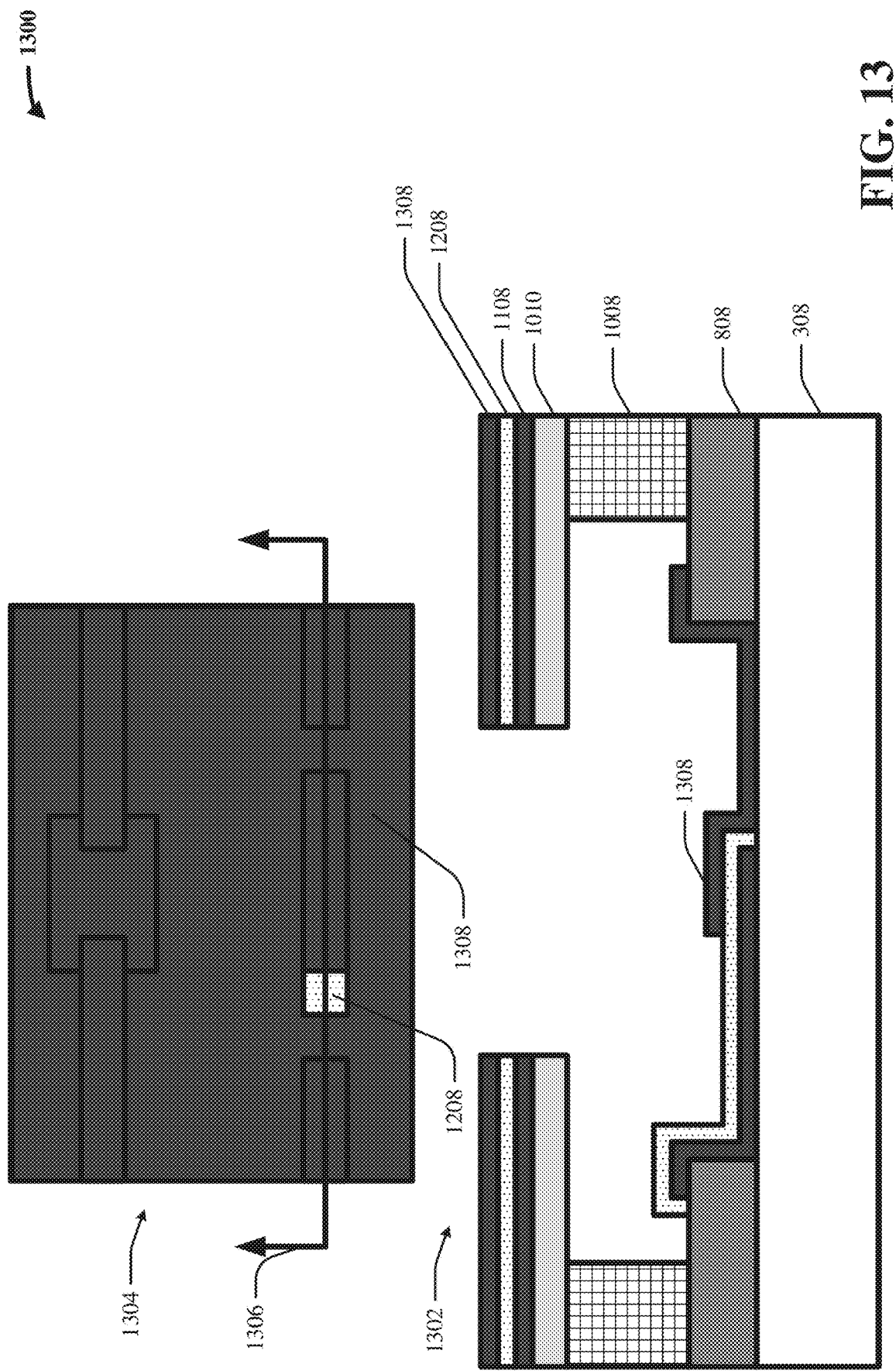

FIG. 13 illustrates a profile view 1302 of an intermediate substrate structure (e.g., continuing from FIG. 12) and a corresponding top view 1304 of the intermediate substrate structure. The profile view 1302 is taken at the cross-section 1306. As shown, a second Josephson Junction electrode layer 1308 (e.g., aluminum, and/or any other suitable Josephson Junction material) can be deposited on the intermediate substrate structure at a second angle (e.g., from top left to bottom right in FIG. 13).

Figure 14:
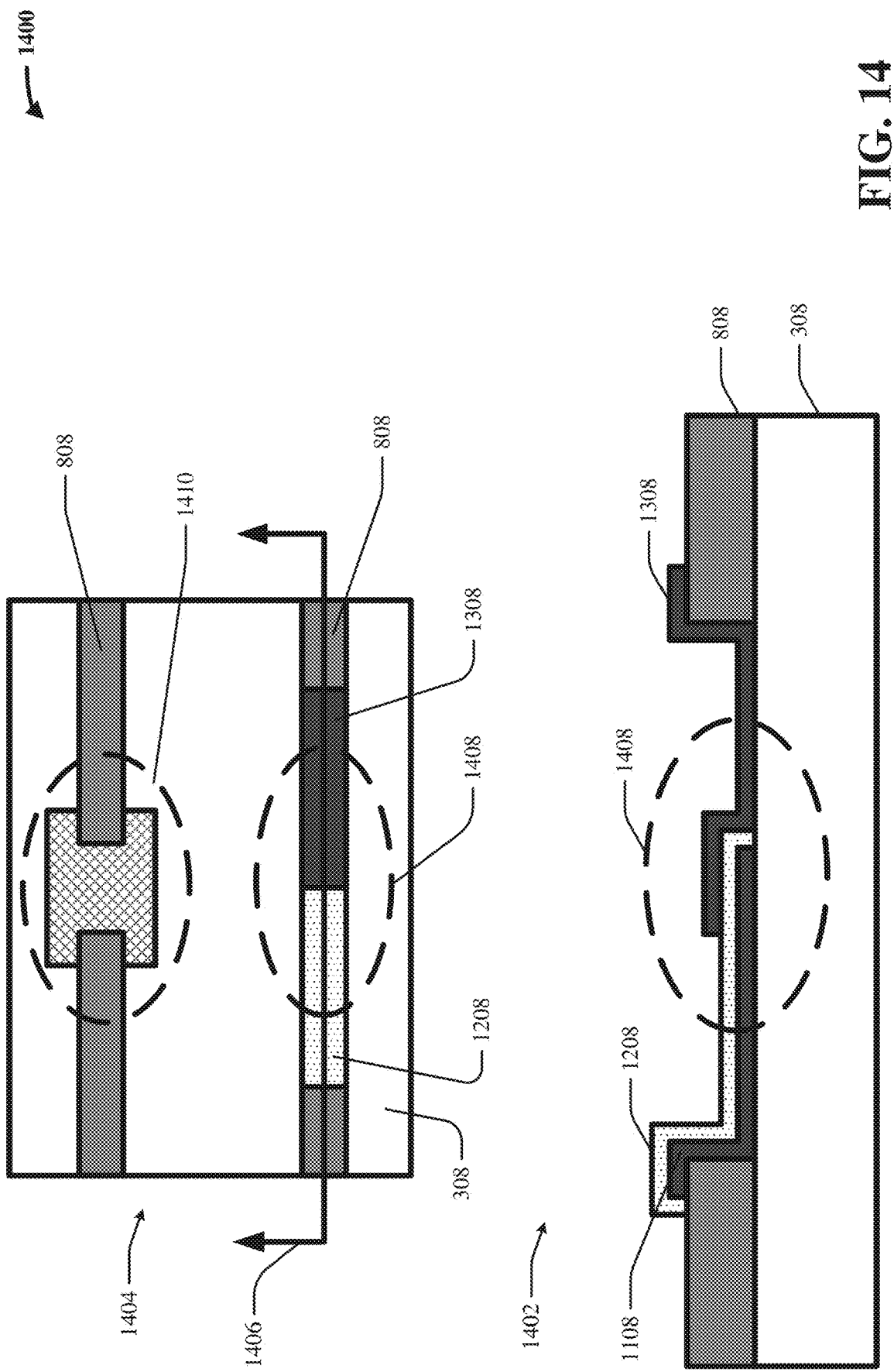

FIG. 14 illustrates a profile view 1402 of an intermediate substrate structure (e.g., continuing from FIG. 13) and a corresponding top view 1404 of the intermediate substrate structure. The profile view 1402 is taken at the cross-section 1406. As shown, the lift-off resist layer 1008 and the photoresist/hardmask layer 1010 can be stripped/removed. As shown, the result can be that the substrate 308 now has a Josephson Junction 1408 (e.g., aluminum/aluminum-oxide/aluminum Josephson Junction) coupled to a pair of electrodes (e.g., 910). In various aspects, the Josephson Junction 1408 can be considered the qubit device 102. Although FIG. 14 depicts only a single Josephson Junction 1408 which normally would have a fixed operational frequency, it should be appreciated that this is for ease of illustration only and that the above-described fabrication operations (e.g., double-angle evaporation and/or any other suitable technique) can be implemented to fabricate any suitable and flux-tunable qubit device on the substrate 308. Also as shown, the substrate 308 can now have the silicon-manganese film 508 in the trench 408 and coupled to a pair of electrodes (e.g., 908). This collective structure can be considered a tunable nanoparticle magnet 1410. In various aspects, the tunable nanoparticle magnet 1410 can be considered the permanent magnet 104.

FIGS. 15-22 illustrate block diagrams of example, non-limiting intermediate structures including a flux coil that can be used to facilitate quantum tuning via permanent magnetic flux elements in accordance with one or more embodiments described herein. That is, FIGS. 15-22 depict, at an exemplary and high level, how an electromagnet 112 (e.g., a flux coil) can be formed. Although FIGS. 15-22 illustrate how the electromagnet 112 can be formed on a different substrate than the silicon-manganese film 508 (e.g., on a different substrate than the permanent magnet 104), it should be appreciated that the herein described fabrication operations can be implemented to form the electromagnet 112 on any suitable substrate, including the same substrate on which the permanent magnet 104 is formed. It should be appreciated that FIGS. 15-22 are exemplary and non-limiting only. Various well-known details regarding patterning, deposition, etching, planarization, annealing, and/or any other aspect of superconductor and/or semiconductor fabrication are omitted for sake of brevity.

Figure 15:
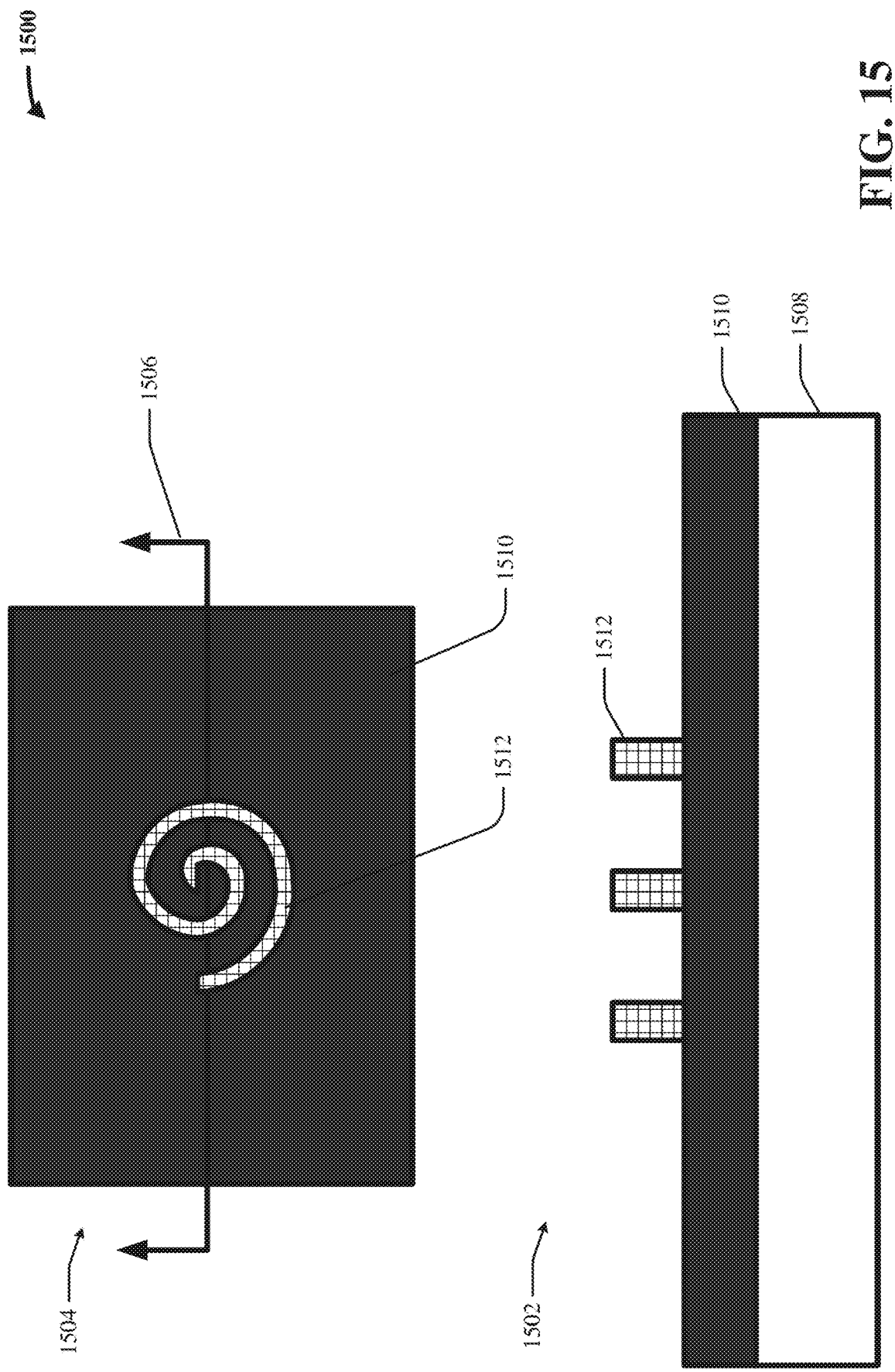
FIGS. 15-22 illustrate block diagrams of example, non-limiting intermediate structures including a flux coil that can be used to facilitate quantum tuning via permanent magnetic flux elements in accordance with one or more embodiments described herein.

FIG. 15 illustrates a profile view 1502 of an initial substrate structure and a corresponding top view 1504 of the initial substrate structure. The profile view 1502 is taken at the cross-section 1506. As shown, a substrate 1508 can comprise silicon, sapphire, and/or any other suitable wafer material. A superconductor 1510 (e.g., niobium, vanadium, tantalum, tantalum nitride, tungsten, titanium, titanium nitride, and/or any other suitable superconductor) can be deposited onto the substrate 1508. As shown, a resist layer 1512 can be deposited onto the superconductor 1510 and patterned into any suitable flux coil shape. In the example shown, the resist layer 1512 is patterned into a spiral shape.

Figure 16:
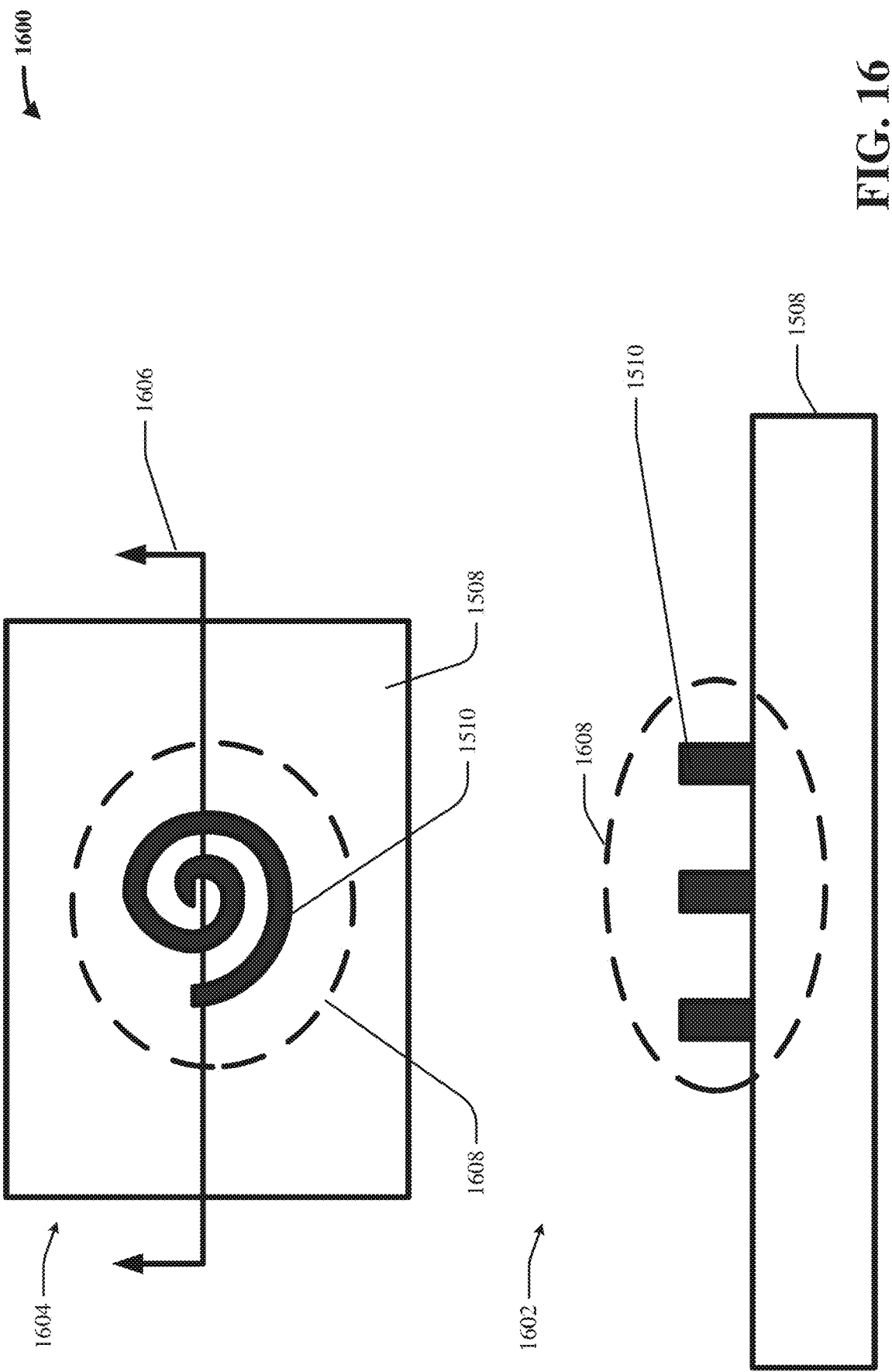

FIG. 16 illustrates a profile view 1602 of an intermediate substrate structure (e.g., continuing from FIG. 15) and a corresponding top view 1604 of the intermediate substrate structure. The profile view 1602 is taken at the cross-section 1606. As shown, reactive ion etching (e.g., and/or any other suitable etching technique) can be used to etch the superconductor 1510, and the resist layer 1512 can be stripped. The result can be the superconducting coil 1608. As shown, the superconducting coil 1608 has a center/inner lead (e.g., the endpoint of the superconducting material 1508 that is positioned in the center of the superconducting coil 1608) and an edge/outer lead (e.g., the endpoint of the superconducting material 1508 that is positioned on the left, outer edge of the superconducting coil 1608).

Figure 17:
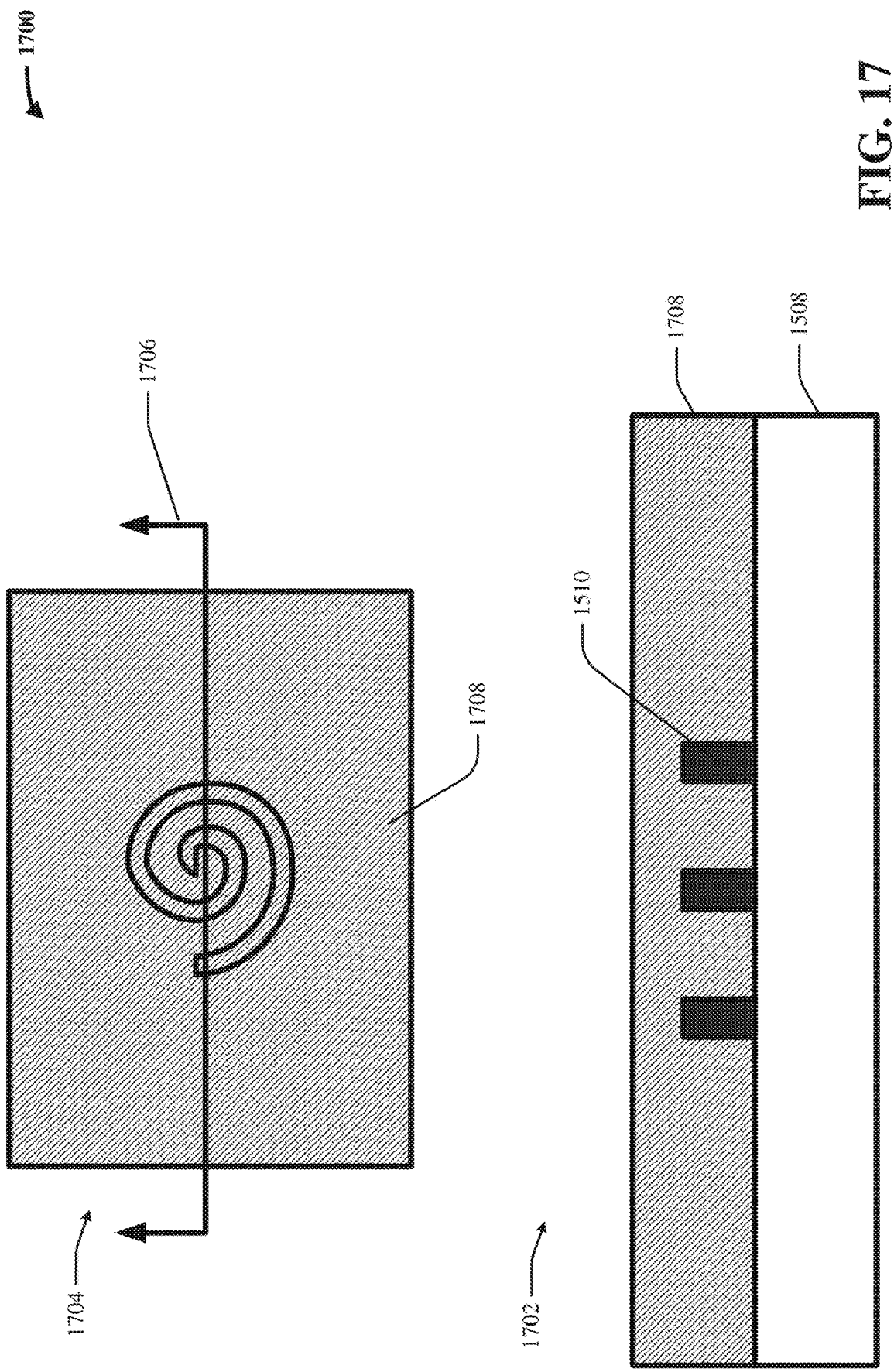

FIG. 17 illustrates a profile view 1702 of an intermediate substrate structure (e.g., continuing from FIG. 16) and a corresponding top view 1704 of the intermediate substrate structure. The profile view 1702 is taken at the cross-section 1706. As shown, a dielectric 1708 (e.g., amorphous silicon, silicon dioxide, and/or any other suitable dielectric material) can be deposited over the intermediate substrate structure.

Figure 18:
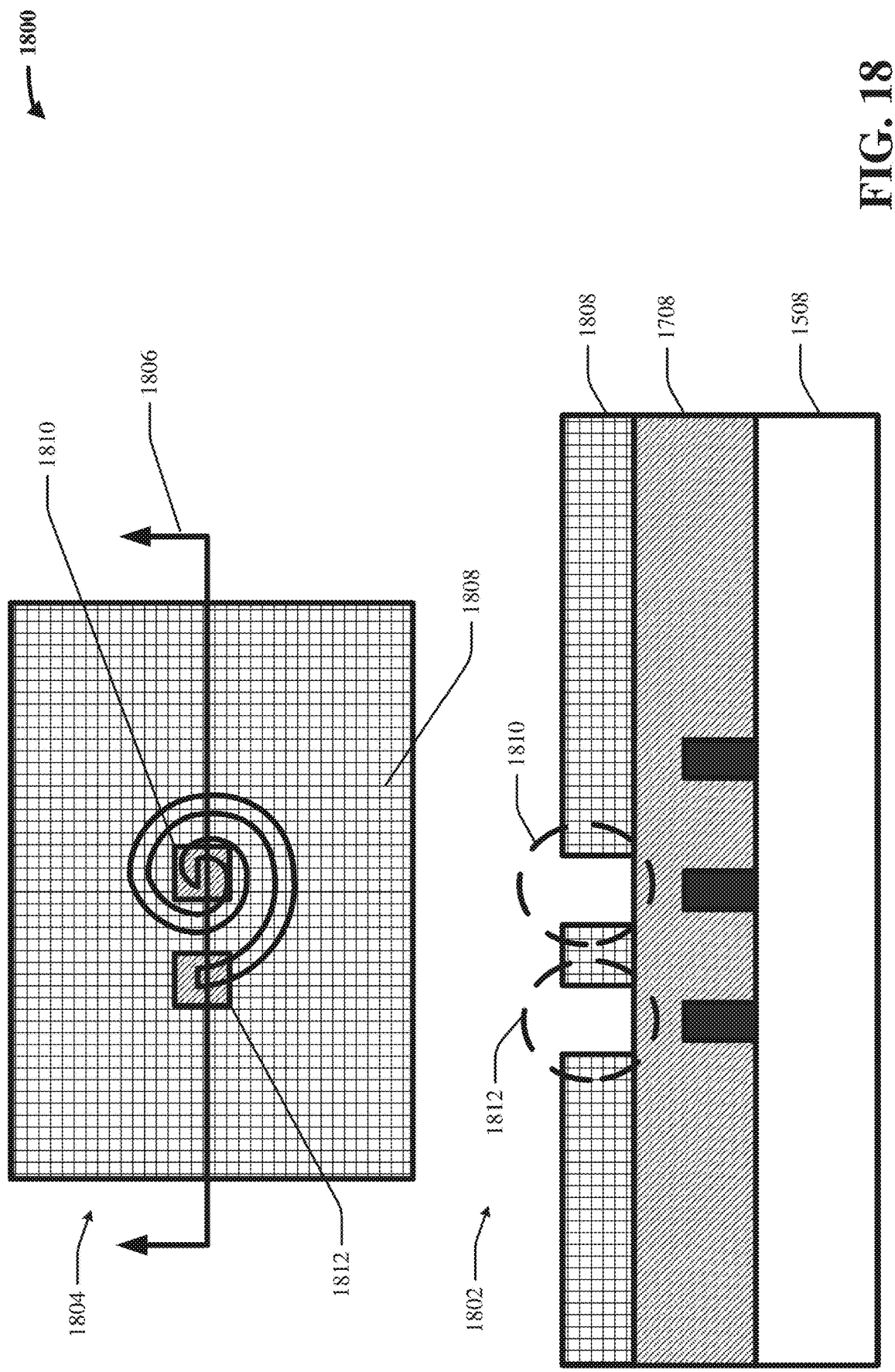

FIG. 18 illustrates a profile view 1802 of an intermediate substrate structure (e.g., continuing from FIG. 17) and a corresponding top view 1804 of the intermediate substrate structure. The profile view 1802 is taken at the cross-section 1806. As shown, a resist layer 1808 can be deposited over the intermediate substrate structure and can be patterned to create vias to the center/inner lead of the superconducting coil 1608 and to the edge/outer lead of the superconducting coil 1608. As shown, the patterned trench 1810 can be subsequently used in etching to create a via through the dielectric 1708 to the center/inner lead, and the patterned trench 1812 can be subsequently used in etching to create a via through the dielectric 1708 to the edge/outer lead.

Figure 19:
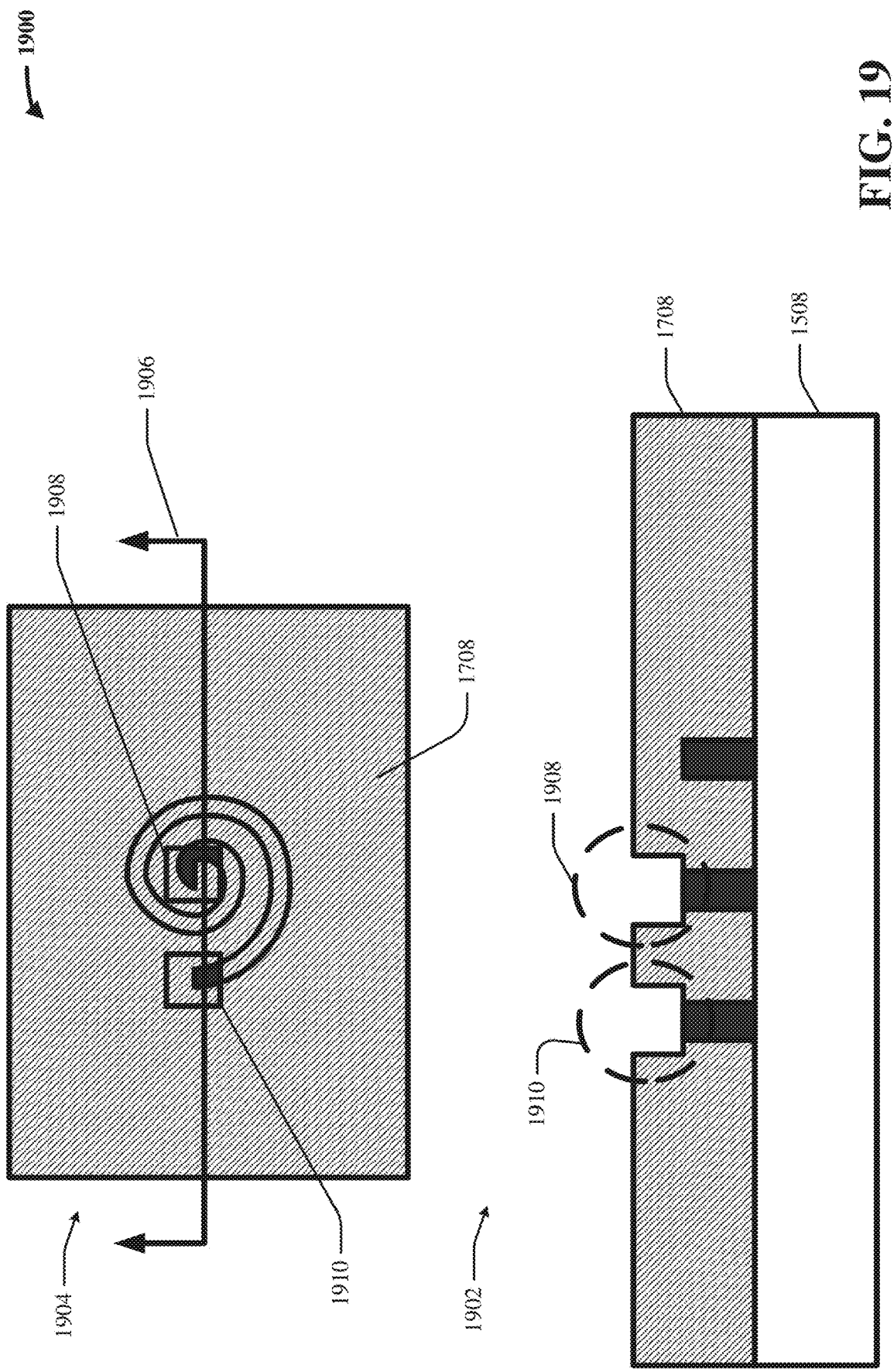

FIG. 19 illustrates a profile view 1902 of an intermediate substrate structure (e.g., continuing from FIG. 18) and a corresponding top view 1904 of the intermediate substrate structure. The profile view 1902 is taken at the cross-section 1906. As shown, reactive ion etching (e.g., and/or any other suitable etching technique) can be used to etch the vias, and the resist layer 1808 can be stripped. As shown, the result can be the via 1908 that passes through the dielectric 1708 to the center/inner lead of the superconducting coil 1608, and the via 1910 that passes through the dielectric 1708 to the edge/outer lead of the superconducting coil 1608. In various aspects, the vias 1908 and/or 1910 need not be uniform; they can, in some cases, be elongated and/or enlarged near the top of the superconducting coil 1608 to provide more conductive area/contact.

Figure 20:
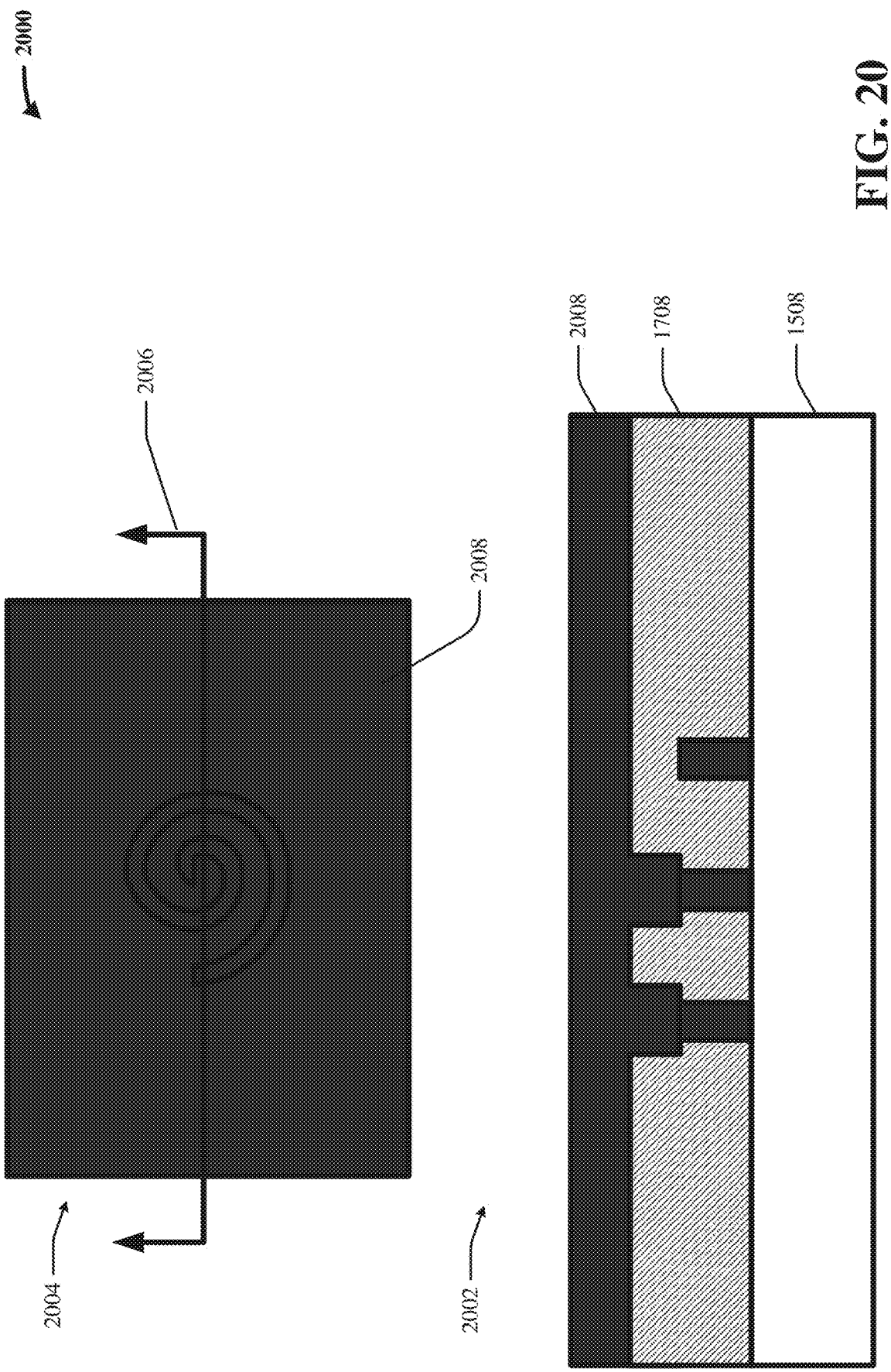

FIG. 20 illustrates a profile view 2002 of an intermediate substrate structure (e.g., continuing from FIG. 19) and a corresponding top view 2004 of the intermediate substrate structure. The profile view 2002 is taken at the cross-section 2006. As shown, a superconductor 2008 (e.g., niobium, vanadium, tantalum, tantalum nitride, tungsten, titanium, titanium nitride, and/or any other suitable superconductor) can be deposited on the intermediate substrate structure. In various aspects, the superconductor 2008 can be used to create wires/electrodes that couple to the leads of the superconducting coil 1608.

Figure 21:
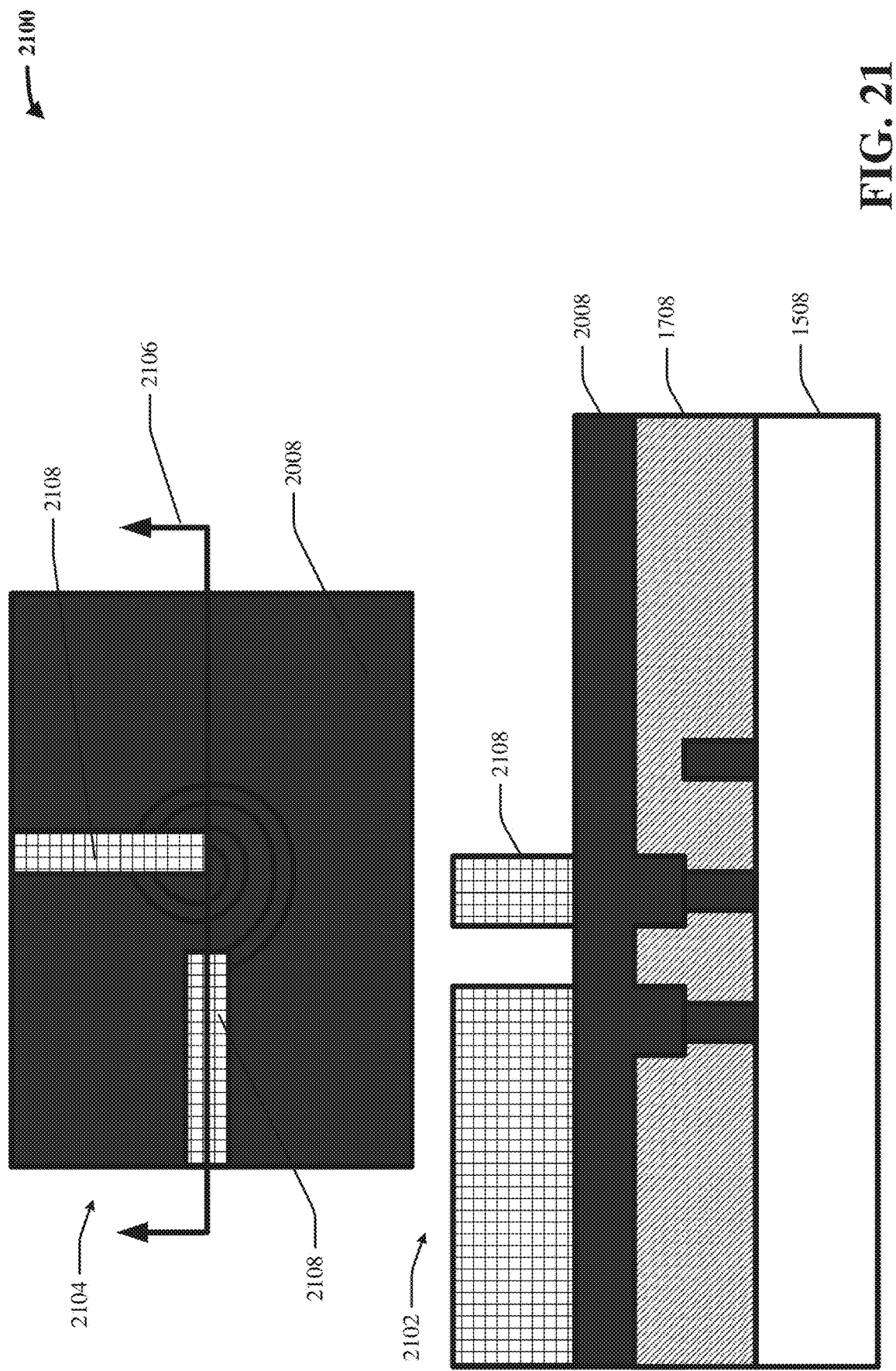

FIG. 21 illustrates a profile view 2102 of an intermediate substrate structure (e.g., continuing from FIG. 20) and a corresponding top view 2104 of the intermediate substrate structure. The profile view 2102 is taken at the cross-section 2106. As shown, a resist layer 2108 can be deposited and patterned into suitably shaped wires for contacting the leads of the superconducting coil 1608. As shown in the top view 2104, the vertically-depicted portion of the resist layer 2108 can be used to etch a superconducting wire (e.g., electrode) that contacts the center/inner lead of the superconducting coil 1608, and the horizontally-depicted portion of the resist layer 2108 can be used to etch a superconducting wire (e.g., electrode) that contacts the edge/outer lead of the superconducting coil 1608.

Figure 22:
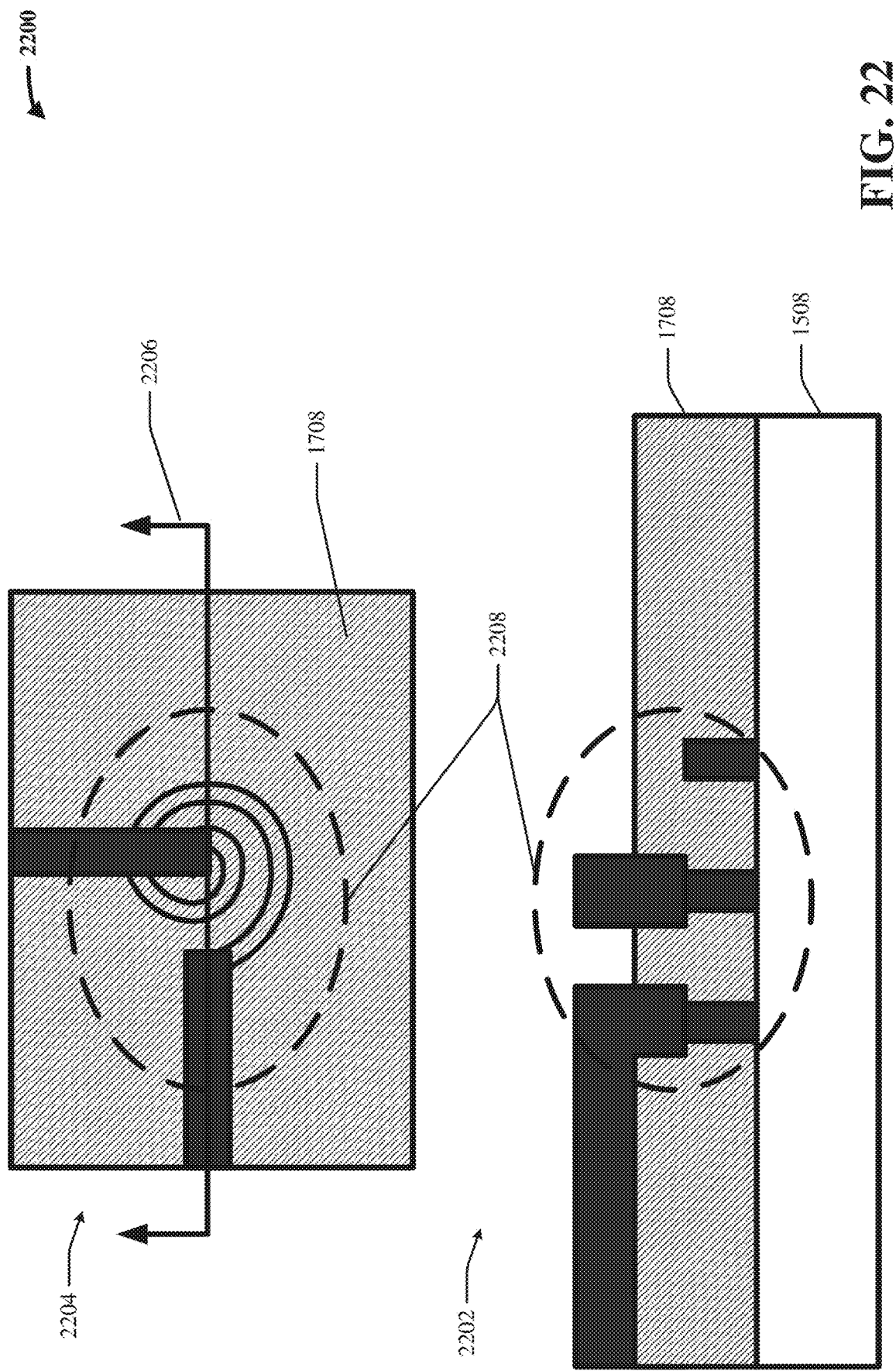

FIG. 22 illustrates a profile view 2202 of an intermediate substrate structure (e.g., continuing from FIG. 21) and a corresponding top view 2204 of the intermediate substrate structure. The profile view 2202 is taken at the cross-section 2206. As shown, reactive ion etching (e.g., and/or any other suitable etching technique) can be used to etch the superconductor 2008, and the resist layer 2108 can be stripped. As shown, the result can be a flux coil 2208 (e.g., the superconducting coil 1608 with electrodes coupled to its center/inner lead and its edge/outer lead). In various aspects, the flux coil 2208 can be considered the electromagnet 112.

In various aspects, lift-off and flyover wiring structures (e.g., as opposed to the fabrication operations discussed above with regard to FIGS. 15-22) could be used to fabricate the flux coil 2208.

Figure 23:
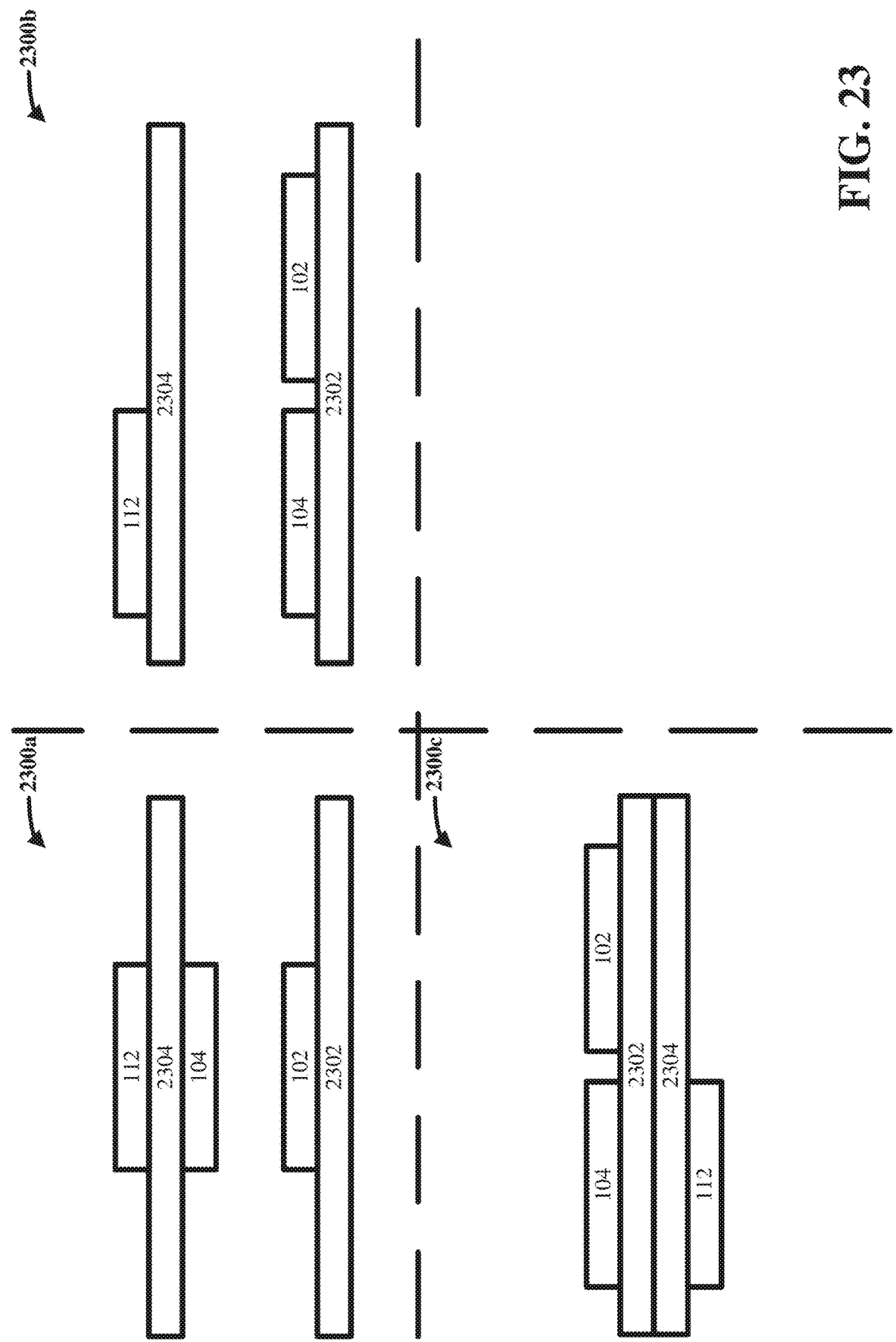
FIG. 23 illustrates block diagrams of example, non-limiting devices that facilitate quantum tuning via permanent magnetic flux elements in accordance with one or more embodiments described herein.

FIG. 23 illustrates block diagrams of example, non-limiting devices that facilitate quantum tuning via permanent magnetic flux elements in accordance with one or more embodiments described herein. In various aspects, FIG. 23 depicts several exemplary and non-limiting configurations that can be implemented in various embodiments of the invention.

As shown in configuration 2300a, the qubit device 102 can be coupled to (e.g., can be fabricated on) a first substrate 2302, and the permanent magnet 104 and the electromagnet 112 can be coupled to (e.g., fabricated on) a second substrate 2304. In various aspects, the permanent magnet 104 and the electromagnet 112 can be fabricated in different chip-planes of the second substrate 2304, as shown, such that they can electromagnetically interact with each other. In various instances, the second substrate 2304 can be bonded above the first substrate 2302 using an air bridge gap (e.g., with suitable spacers), such that the permanent magnet 104 and the qubit device 102 can electromagnetically interact with each other. In various aspects, a metallic film (e.g., copper) can be applied below the first substrate 2302 to improve thermal conductive properties (e.g., to help dissipate heat). In various aspects, a spacer wafer (not shown) can be placed in between the first substrate 2302 and the second substrate 2304, leaving the chip area open and using kerf area for the spacer region. In various aspects, organic glue and/or silver epoxy can be implemented.

As shown in configuration 2300b, the qubit device 102 and the permanent magnet 104 can be coupled to (e.g., fabricated on) the first substrate 2302, and the electromagnet 112 can be coupled to (e.g., fabricated on) the second substrate 2304. In various instances, the second substrate 2304 can be bonded above the first substrate 2302 using an air bridge gap (e.g., with suitable spacers), such that the permanent magnet 104 and the electromagnet 112 can electromagnetically interact with each other. Again, suitable spacers can be implemented.

As shown in configuration 2300c, the first substrate 2302 and the second substrate 2304 can be bonded together back-to-back to enable external electromagnetic interaction between the permanent magnet 104 and the electromagnet 112. In various aspects, this can enable setting the magnetic alignment separately for each qubit device. In various instances, a suitable adhesive bonding layer can be implemented to bond the first substrate 2302 to the second substrate 2304. In various cases, simple low temperature bonding with spin-on organic materials can be used. In various aspects, a 150 nm overlay can be implemented with standard bonding equipment. In various aspects, it can be possible to contact the wires/electrodes (e.g., contact pads) of the qubit device 102 from above and the wires/electrodes (e.g., contact pads) of the electromagnet 112 from below.

It should be appreciated that FIG. 23 is exemplary and non-limiting only and is not necessarily drawn to scale. Any other suitable configurations can be implemented in various embodiments of the invention. In various aspects, any suitable configuration that places the permanent magnet 104 in sufficient spatial proximity to the qubit device 102 can be implemented, where "sufficient spatial proximity" between the permanent magnet 104 and the qubit device 102 can include any suitable physical distance such that the permanent magnet 104 can electromagnetically interact with (e.g., can emit the first magnetic flux 106 onto) the qubit device 102. In various aspects, it should be appreciated that "sufficient spatial proximity" between the permanent magnet 104 and the qubit device 102 can vary with operational context (e.g., size of the qubit device 102, strength and/or size of the permanent magnet 104). In various aspects, any suitable configuration that places the electromagnet 112 in sufficient spatial proximity to the permanent magnet 104 can be implemented, where "sufficient spatial proximity" between the electromagnet 112 and the permanent magnet 104 can include any suitable physical distance such that the electromagnet 112 can electromagnetically interact with (e.g., can emit the second magnetic flux 114 onto) the permanent magnet 104. In various aspects, it should be appreciated that "sufficient spatial proximity" between the electromagnet 112 and the permanent magnet 104 can vary with operational context (e.g., size of the permanent magnet 104, strength and/or size of the electromagnet 112).

Figure 24:
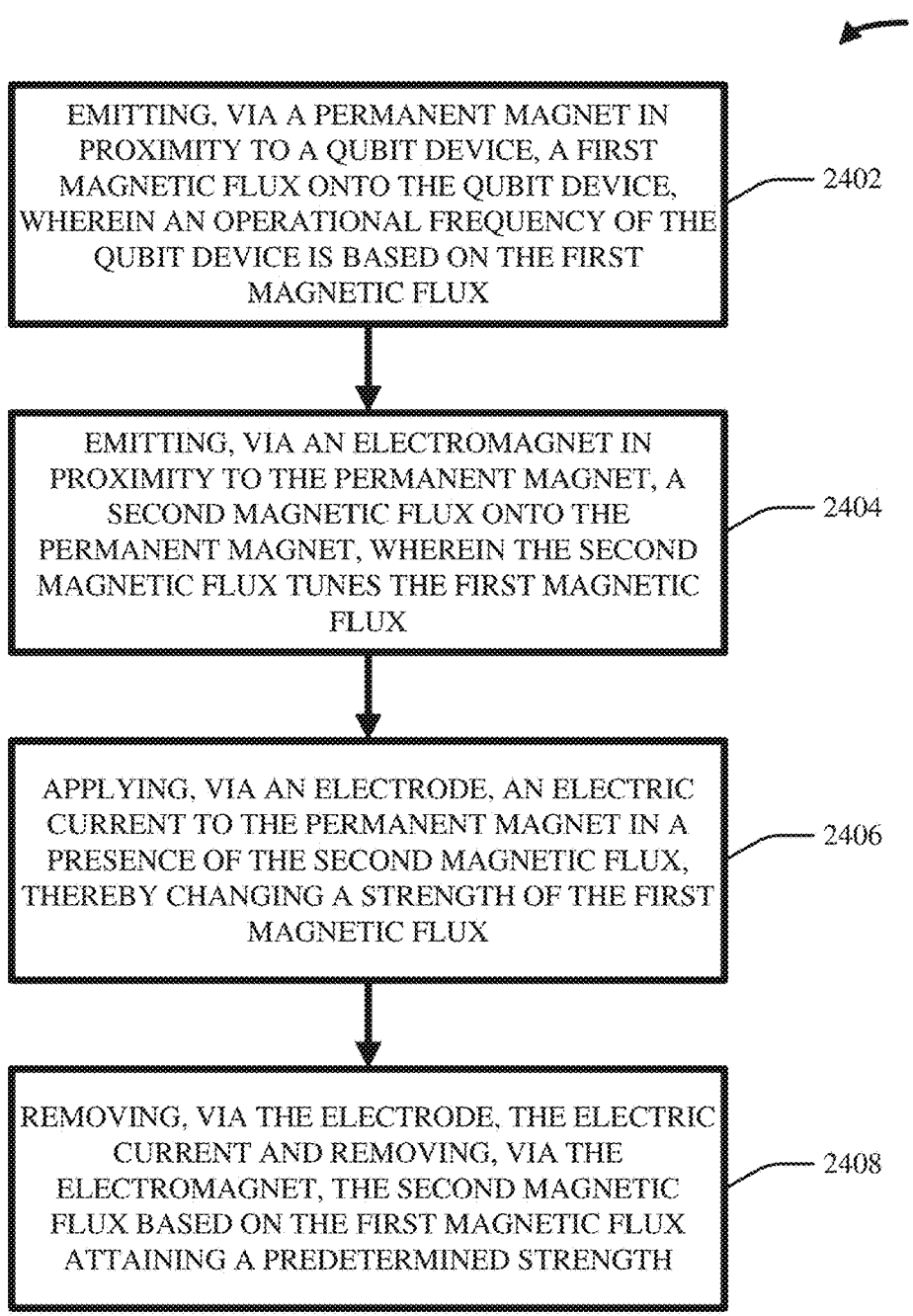
FIG. 24 illustrates a flow diagram of an example, non-limiting method of facilitating quantum tuning via permanent magnetic flux elements in accordance with one or more embodiments described herein.

FIG. 24 illustrates a flow diagram of an example, non-limiting method 2400 of facilitating quantum tuning via permanent magnetic flux elements in accordance with one or more embodiments described herein. In various aspects, the method 2400 can be implemented by the system 100.

In various embodiments, act 2402 can include emitting, via a permanent magnet (e.g., 104) in proximity to a qubit device (e.g., 102), a first magnetic flux (e.g., 106) onto the qubit device. In various aspects, an operational frequency of the qubit device can be based on the first magnetic flux.

In various instances, act 2404 can include emitting, via an electromagnet (e.g., 112) in proximity to the permanent magnet, a second magnetic flux (e.g., 114) onto the permanent magnet. In various aspects, the second magnetic flux can tune the first magnetic flux.

In various aspects, act 2406 can include applying, via an electrode (e.g., 108) an electric current (e.g., 110) to the permanent magnet in a presence of the second magnetic flux. In various cases, this can change a strength of the first magnetic flux.

In various instances, act 2408 can include removing, via the electrode, the electric current and removing, via the electromagnet, the second magnetic flux based on the first magnetic flux attaining a predetermined strength.

In various aspects, the following brief discussion can provide some exemplary and non-limiting quantitative values that can be implemented in various embodiments of the invention. In various embodiments, it can be beneficial to apply 1 flux quantum (e.g., $2 \times 10^{-15}$ T-m$^2$) at the qubit device 102. For a 10×10 µm$^2$ SQUID loop, this can require 0.2 gauss at the SQUID loop. In various instances, it can be beneficial to set the flux (e.g., 106) with about 1% precision (e.g., meaning that the magnetic field should be adjustable in increments of less than 0.002 gauss). It can be beneficial for stability to be better than the limits set by intrinsic flux noise, which has a 1/f characteristic (where f is the operational frequency of the qubit device 102) of about 1 microPhi0 ($2 \times 10^{-21}$ T-m$^2$) per root-Hz at 1 Hz. As a rough approximation, it can be beneficial for total root-mean-square stability to be below the level of 1 microPhi0, or for field stability within a 10×10 µm$^2$ loop to be below $2 \times 10^{-7}$ gauss root-mean-square.

In various embodiments, the permanent magnet 104 can be tuned ex situ.

Figure 25:
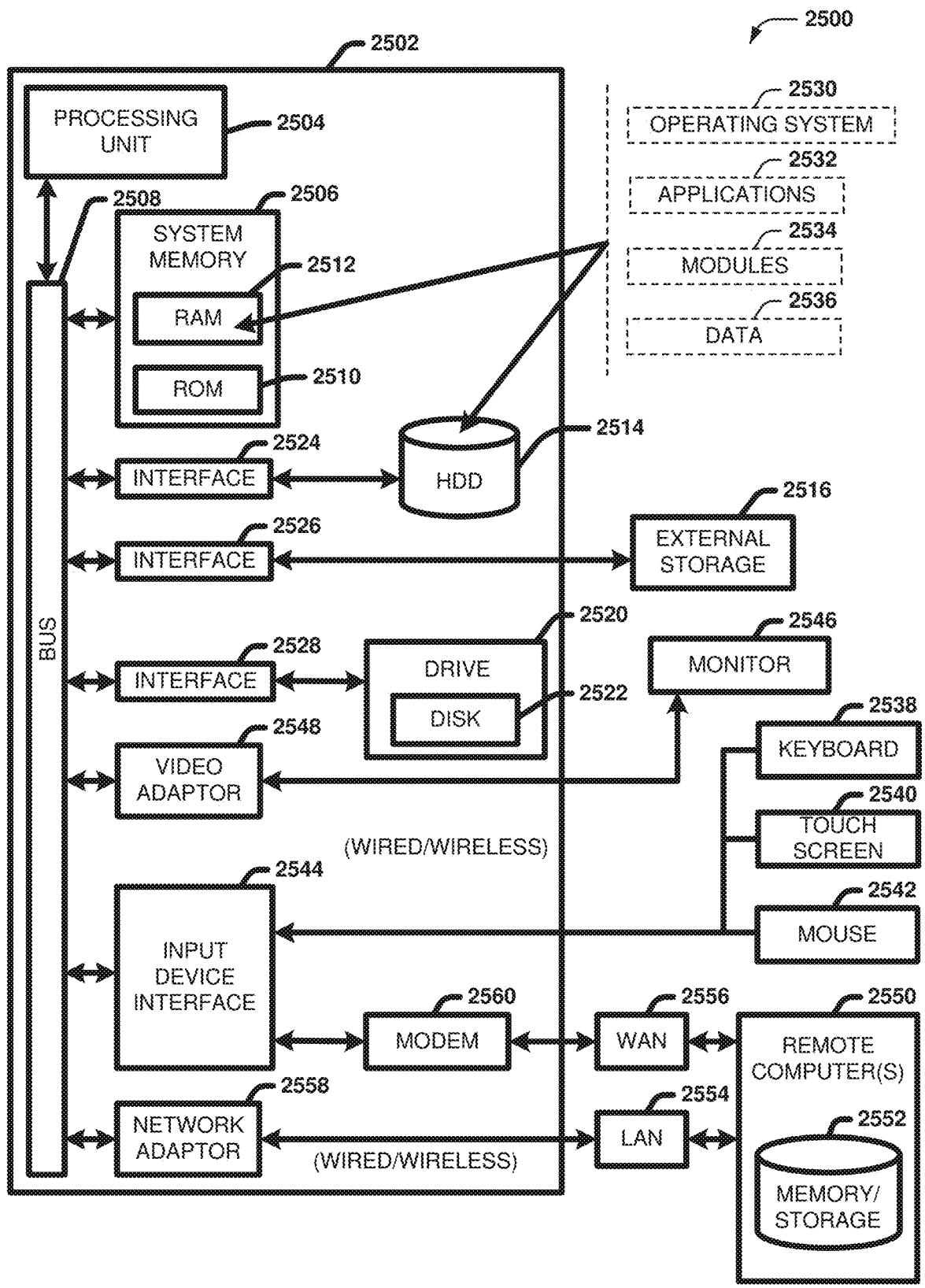
FIG. 25 illustrates a block diagram of an example, non-limiting operating environment in which one or more embodiments described herein can be facilitated.

In order to provide additional context for various embodiments described herein, FIG. 25 and the following discussion are intended to provide a brief, general description of a suitable computing environment 2500 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and the like, each of which can be operatively coupled to one or more associated devices.

The illustrated embodiments of the embodiments herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), flash memory or other memory technology, compact disk read only memory (CD-ROM), digital versatile disk (DVD), Blu-ray disc (BD) or other optical disk storage, magnetic cassettes, magnetic tape, magnetic disk storage or other magnetic storage devices, solid state drives or other solid state storage devices, or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 25, the example environment 2500 for implementing various embodiments of the aspects described herein includes a computer 2502, the computer 2502 including a processing unit 2504, a system memory 2506 and a system bus 2508. The system bus 2508 couples system components including, but not limited to, the system memory 2506 to the processing unit 2504. The processing unit 2504 can be any of various commercially available processors. Dual microprocessors and other multi-processor architectures can also be employed as the processing unit 2504.

The system bus 2508 can be any of several types of bus structure that can further interconnect to a memory bus (with or without a memory controller), a peripheral bus, and a local bus using any of a variety of commercially available bus architectures. The system memory 2506 includes ROM 2510 and RAM 2512. A basic input/output system (BIOS) can be stored in a non-volatile memory such as ROM, erasable programmable read only memory (EPROM), EEPROM, which BIOS contains the basic routines that help to transfer information between elements within the computer 2502, such as during startup. The RAM 2512 can also include a high-speed RAM such as static RAM for caching data.

The computer 2502 further includes an internal hard disk drive (HDD) 2514 (e.g., EIDE, SATA), one or more external storage devices 2516 (e.g., a magnetic floppy disk drive (FDD) 2516, a memory stick or flash drive reader, a memory card reader, etc.) and a drive 2520, e.g., such as a solid state drive, an optical disk drive, which can read or write from a disk 2522, such as a CD-ROM disc, a DVD, a BD, etc. Alternatively, where a solid state drive is involved, disk 2522 would not be included, unless separate. While the internal HDD 2514 is illustrated as located within the computer 2502, the internal HDD 2514 can also be configured for external use in a suitable chassis (not shown). Additionally, while not shown in environment 2500, a solid state drive (SSD) could be used in addition to, or in place of, an HDD 2514. The HDD 2514, external storage device(s) 2516 and drive 2520 can be connected to the system bus 2508 by an HDD interface 2524, an external storage interface 2526 and a drive interface 2528, respectively. The interface 2524 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 2502, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 2512, including an operating system 2530, one or more application programs 2532, other program modules 2534 and program data 2536. All or portions of the operating system, applications, modules, and/or data can also be cached in the RAM 2512. The systems and methods described herein can be implemented utilizing various commercially available operating systems or combinations of operating systems.

Computer 2502 can optionally comprise emulation technologies. For example, a hypervisor (not shown) or other intermediary can emulate a hardware environment for operating system 2530, and the emulated hardware can optionally be different from the hardware illustrated in FIG. 25. In such an embodiment, operating system 2530 can comprise one virtual machine (VM) of multiple VMs hosted at computer 2502. Furthermore, operating system 2530 can provide runtime environments, such as the Java runtime environment or the .NET framework, for applications 2532. Runtime environments are consistent execution environments that allow applications 2532 to run on any operating system that includes the runtime environment. Similarly, operating system 2530 can support containers, and applications 2532 can be in the form of containers, which are lightweight, standalone, executable packages of software that include, e.g., code, runtime, system tools, system libraries and settings for an application.

Further, computer 2502 can be enable with a security module, such as a trusted processing module (TPM). For instance with a TPM, boot components hash next in time boot components, and wait for a match of results to secured values, before loading a next boot component. This process can take place at any layer in the code execution stack of computer 2502, e.g., applied at the application execution level or at the operating system (OS) kernel level, thereby enabling security at any level of code execution.

A user can enter commands and information into the computer 2502 through one or more wired/wireless input devices, e.g., a keyboard 2538, a touch screen 2540, and a pointing device, such as a mouse 2542. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 2504 through an input device interface 2544 that can be coupled to the system bus 2508, but can be connected by other interfaces, such as a parallel port, an IEEE 1394 serial port, a game port, a USB port, an IR interface, a BLUETOOTH® interface, etc.

A monitor 2546 or other type of display device can be also connected to the system bus 2508 via an interface, such as a video adapter 2548. In addition to the monitor 2546, a computer typically includes other peripheral output devices (not shown), such as speakers, printers, etc.

The computer 2502 can operate in a networked environment using logical connections via wired and/or wireless communications to one or more remote computers, such as a remote computer(s) 2550. The remote computer(s) 2550 can be a workstation, a server computer, a router, a personal computer, portable computer, microprocessor-based entertainment appliance, a peer device or other common network node, and typically includes many or all of the elements described relative to the computer 2502, although, for purposes of brevity, only a memory/storage device 2552 is illustrated. The logical connections depicted include wired/wireless connectivity to a local area network (LAN) 2554 and/or larger networks, e.g., a wide area network (WAN) 2556. Such LAN and WAN networking environments are commonplace in offices and companies, and facilitate enterprise-wide computer networks, such as intranets, all of which can connect to a global communications network, e.g., the Internet.

When used in a LAN networking environment, the computer 2502 can be connected to the local network 2554 through a wired and/or wireless communication network interface or adapter 2558. The adapter 2558 can facilitate wired or wireless communication to the LAN 2554, which can also include a wireless access point (AP) disposed thereon for communicating with the adapter 2558 in a wireless mode.

When used in a WAN networking environment, the computer 2502 can include a modem 2560 or can be connected to a communications server on the WAN 2556 via other means for establishing communications over the WAN 2556, such as by way of the Internet. The modem 2560, which can be internal or external and a wired or wireless device, can be connected to the system bus 2508 via the input device interface 2544. In a networked environment, program modules depicted relative to the computer 2502 or portions thereof, can be stored in the remote memory/storage device 2552. It will be appreciated that the network connections shown are example and other means of establishing a communications link between the computers can be used.

When used in either a LAN or WAN networking environment, the computer 2502 can access cloud storage systems or other network-based storage systems in addition to, or in place of, external storage devices 2516 as described above, such as but not limited to a network virtual machine providing one or more aspects of storage or processing of information. Generally, a connection between the computer 2502 and a cloud storage system can be established over a LAN 2554 or WAN 2556 e.g., by the adapter 2558 or modem 2560, respectively. Upon connecting the computer 2502 to an associated cloud storage system, the external storage interface 2526 can, with the aid of the adapter 2558 and/or modem 2560, manage storage provided by the cloud storage system as it would other types of external storage. For instance, the external storage interface 2526 can be configured to provide access to cloud storage sources as if those sources were physically connected to the computer 2502.

The computer 2502 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adaptor card or network interface in each computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a qubit device;
   a permanent magnet in first proximity to the qubit device and emitting a first magnetic flux onto the qubit device, wherein an operational frequency of the qubit device is based on the first magnetic flux; and
   an electromagnet in second proximity to the permanent magnet and emitting a second magnetic flux onto the permanent magnet, wherein the second magnetic flux tunes the first magnetic flux.

2. The system of claim 1, wherein the permanent magnet is a nanoparticle magnet.

3. The system of claim 2, wherein the nanoparticle magnet comprises manganese nanoparticles embedded in a silicon matrix.

4. The system of claim 3, further comprising:
an electrode that applies an electric current to the nanoparticle magnet in a presence of the second magnetic flux, thereby changing a strength of the first magnetic flux.

5. The system of claim 4, wherein the electrode is powered down removing the electric current and the electromagnet is powered down removing the second magnetic flux based on the first magnetic flux attaining a predetermined strength.

6. The system of claim 1, wherein the qubit device is a superconducting quantum interference device loop.

7. The system of claim 1, wherein the qubit device is on a first substrate and the permanent magnet and the electromagnet are on a second substrate.

8. The system of claim 1, wherein the qubit device and the permanent magnet are on a first substrate and the electromagnet is on a second substrate.

9. A method, comprising:
emitting, via a permanent magnet in first proximity to a qubit device, a first magnetic flux onto the qubit device, wherein an operational frequency of the qubit device is based on the first magnetic flux; and
emitting, via an electromagnet in second proximity to the permanent magnet, a second magnetic flux onto the permanent magnet, wherein the second magnetic flux tunes the first magnetic flux.

10. The method of claim 9, wherein the permanent magnet is a nanoparticle magnet.

11. The method of claim 10, wherein the nanoparticle magnet comprises manganese nanoparticles embedded in a silicon matrix.

12. The method of claim 11, further comprising:
applying, via an electrode, an electric current to the nanoparticle magnet in a presence of the second magnetic flux, thereby changing a strength of the first magnetic flux.

13. The method of claim 12, further comprising:
removing, via powering down the electrode, the electric current and removing, via powering down the electromagnet, the second magnetic flux based on the first magnetic flux attaining a predetermined strength.

14. The method of claim 9, wherein the qubit device is a superconducting quantum interference device loop.

15. The method of claim 9, wherein the qubit device is on a first substrate and the permanent magnet and the electromagnet are on a second substrate.

16. The method of claim 9, wherein the qubit device and the permanent magnet are on a first substrate and the electromagnet is on a second substrate.

17. An apparatus, comprising:
a nanoparticle magnet in first proximity to a Josephson Junction device and that emits a tunable permanent magnetic field onto the Josephson Junction device, wherein an operational frequency of the Josephson Junction device is based on the tunable permanent magnetic field; and
a flux coil in second proximity to the nanoparticle magnet and that tunes the tunable permanent magnetic field.

18. The apparatus of claim 17, wherein the nanoparticle magnet comprises manganese nanoparticles embedded in a silicon matrix.

19. The apparatus of claim 18, further comprising:
an electrode that applies a current to the nanoparticle magnet as the nanoparticle magnet is exposed to a magnetic field of the flux coil, thereby changing a value of the tunable permanent magnetic field.

20. The apparatus of claim 19, wherein powering down the electrode removes the electric current and powering down the flux coil removes the magnetic field based on the tunable permanent magnetic field attaining a threshold value.

* * * * *